(12) United States Patent
Tinnemeyer

(10) Patent No.: US 7,072,871 B1
(45) Date of Patent: Jul. 4, 2006

(54) FUZZY LOGIC METHOD AND APPARATUS FOR BATTERY STATE OF HEALTH DETERMINATION

(75) Inventor: Jörn Tinnemeyer, Richmond (CA)

(73) Assignee: Cadex Electronics Inc., Richmond (CA)

( * ) Notice: Subject to any disclaimer, the term of this patent is extended or adjusted under 35 U.S.C. 154(b) by 730 days.

(21) Appl. No.: 09/933,743

(22) Filed: Aug. 22, 2001

(51) Int. Cl.
G06F 15/18 (2006.01)

(52) U.S. Cl. .............................. 706/1; 320/132; 395/3; 706/900

(58) Field of Classification Search ................ 320/130, 320/132, 127, 106; 702/63, 88; 706/1
See application file for complete search history.

(56) References Cited

U.S. PATENT DOCUMENTS

| | | | | |
|---|---|---|---|---|
| 5,372,898 | A | 12/1994 | Atwater et al. | 429/90 |
| 5,596,260 | A * | 1/1997 | Moravec et al. | 320/135 |
| 5,651,100 | A * | 7/1997 | Hayashi et al. | 706/52 |
| 5,664,066 | A * | 9/1997 | Sun et al. | 706/25 |
| 5,708,593 | A * | 1/1998 | Saby et al. | 702/85 |
| 5,714,866 | A | 2/1998 | S et al. | 320/452 |
| 5,739,673 | A | 4/1998 | Le Van Suu | 320/439 |
| 5,758,025 | A * | 5/1998 | Wu | 706/3 |
| 5,780,992 | A * | 7/1998 | Beard | 320/106 |
| 5,977,750 | A | 11/1999 | Ng et al. | 320/432 |
| 6,072,299 | A | 6/2000 | Kurle et al. | 320/442 |
| 6,208,114 | B1 * | 3/2001 | Jones et al. | 320/107 |
| 6,272,477 | B1 * | 8/2001 | Kelly et al. | 706/5 |
| 6,366,054 | B1 * | 4/2002 | Hoenig et al. | 320/132 |
| 6,404,164 | B1 * | 6/2002 | Bean et al. | 320/106 |
| 6,445,189 | B1 * | 9/2002 | Pakonen et al. | 324/536 |
| 6,456,988 | B1 * | 9/2002 | Singh et al. | 706/2 |
| 6,512,937 | B1 * | 1/2003 | Blank et al. | 600/322 |
| 6,526,361 | B1 * | 2/2003 | Jones et al. | 702/63 |
| 6,835,491 | B1 * | 12/2004 | Gartstein et al. | 429/92 |
| 6,898,585 | B1 * | 5/2005 | Benson et al. | 706/52 |
| 2002/0105428 | A1 * | 8/2002 | Benson et al. | 340/635 |

FOREIGN PATENT DOCUMENTS

GB    2377833 A    *    1/2003

(Continued)

OTHER PUBLICATIONS

Shi et al; A learning algorithm for tuning fuzzy inference rules; IEEE International Fuzzy Systems Conference Proceedings; vol. 1; Aug. 22-25, 1999; pp. 378-382.*

(Continued)

*Primary Examiner*—Anthony Knight
*Assistant Examiner*—Ronald E. Williams, Jr.
(74) *Attorney, Agent, or Firm*—Oyen Wiggs Green & Mutala LLP

(57) ABSTRACT

A system for determining the state-of-health of batteries has an adaptive component. The system tests a battery by measuring a number of electrochemical parameters and using fuzzy logic to compute a state-of-health for the battery. The fuzzy logic computations are based upon membership functions which are preferably triangular. The membership functions may be stored in a matrix. The adaptive component adapts the system for use with new models of battery by obtaining a reliable measurement of SoH for a number of calibration batteries. Electrochemical parameters of the calibration batteries are measured. The adaptive component modifies a prototype matrix selected to match the chemistry type of the calibration batteries by scaling, translating and flexing its membership functions to achieve a matrix which specifies membership functions suitable for assessing state-of-health of the new model of battery.

39 Claims, 13 Drawing Sheets

FOREIGN PATENT DOCUMENTS

| WO | WO 98/40925 | 9/1998 |
|----|-------------|--------|
| WO | WO 98/40925 A1 | 9/1998 |
| WO | WO 00/19578 A1 | 4/2000 |

OTHER PUBLICATIONS

Rine et al; A reusable software adaptive fuzzy controller architecture; ACM symposium on Applied Computing Proceedings; Feb. 1996.*

Buchmann "Artificial Intelligence Reads Battery State-of-Health in Three Minutes" (2001).*

Zhang et al; Learning fuzzy concept prototypes using genetic algorithms; IEEE International Fuzzy Systems Conference Proceedings; vol. 3; Aug. 22-25, 1999; pp. 1790-1795.*

Cox et al; Battery state of health monitoring, combining conductance technology with other measurement parameters for real-time battery performance analysis; Twenty-second International Telecommunications Energy Conference; Sep. 10-14, 2000; pp. 342-347.*

Brooks "Smart Accelerometers with Wireless Interfaces for the Condition Monitoring Industry" (May 2-5, 1999).*

Spath et al; The detection of the state of health of lead-acid batteries; 19th International Telecommunications Energy Conference; Oct. 19-23, 1997; pp. 681-686.*

Mao et al; Approximation capability of fuzzy systems using translations and dilations of one fixed function as membership functions; IEEE Transactions on Fuzzy Systems; vol. 5, Is. 3; Aug. 1997; pp. 468-473.*

Rao et al "A tunable fuzzy logic controller for vehicle-active suspension systems"; Fuzzy Sets and Systems 85; 1997; pp. 11-21.*

Chen et al; On parametric t-norm-sum-gravity inference method for fuzzy logic control; IEEE International Conference on Fuzzy Systems Proceedings; vol. 1; May 4-9, 1998, pp. 510-515.*

Florescu et al; Heuristic linearization of external characteristics of DC-DC converters using fuzzy control; Proceedings of the IEEE International Symposium on Industrial Electronics; vol. 1; Jul. 12-16, 1999; pp. 274-279.*

Pedrycz et al; Information granulation for concept formation; Proceedings of the ACM symposium on Applied computing; Mar. 2000.*

Eastman "Guide to GIS and Image Processing" (May 2001).*

Buchmann; www.buchmann.ca/article 14-page2.asp; "Battery Analyzers"; 2001.*

Jou et al; An adaptive fuzzy logic controller: its VLSI architecture and applications; IEEE Transactions on Very Large Scale Integration Systems; vol. 8, Is. 1; Feb. 2000; pp. 52-60.*

Emami et al; Development of a systematic methodology of fuzzy logic modeling; IEEE Transactions on Fuzzy Systems; vol. 6, Is. 3; Aug. 1998; pp. 346-361.*

Gurries; Smart Battery Charger is Programmed via the SMBus; Linear Technology Magazine; www.linear.com/pc/downloadDocument.do?navid=H0,C1,C1003,C1037, C1078,C1089,P1762,D4852; Nov. 1999; pp. 6-10, 18.*

W. Arthur Byers and S.P. Perone, "Computerized Pattern Recognition Applied to Ni-Cd Cell Lifetime Prediction", J. Electrochem. Soc., vol. 126, No. 5, p. 720-725, May 1979.

F. Huet, "A review of impedance measurements for determination of the state-of-charge or state-of-health of secondary batteries", Journal of Power Sources 70, 1998, p. 59-69.

Pritpal Singh et al., "A Fuzzy System Methodology to Determine State-of-Charge in Primary Li/So2 and Other Batteries".

* cited by examiner

INTERNAL RESISTANCE

FUZZY LOGIC METHOD AND APPARATUS FOR BATTERY STATE OF HEALTH DETERMINATION

TECHNICAL FIELD

This invention relates to fuzzy logic based methods and apparatus for providing an output which is a fuzzy logic function of a plurality of inputs. The invention has particular application to methods and apparatus for determining the states-of-health of electrochemical batteries. In this context, the invention provides systems which measure electrical characteristics of a battery and use fuzzy logic rules to determine state-of-health (SoH) from the measured electrical characteristics.

BACKGROUND

A wide variety of rechargeable batteries are used today (in this specification and the appended claims, the term battery includes individual electrochemical cells as well as batteries which combine a number of electrochemical cells). Rechargeable batteries power a wide range of devices including things as diverse as cellular telephones, forklift trucks, backup power supplies, electric carts, electronic test equipment and so on.

Rechargeable batteries have finite lives. The ability of a battery to hold a charge and to deliver its rated current degrades with use and with the passage of time. Eventually batteries must be replaced. Also, batteries of types which have certain chemistries require periodic servicing. For example, cycling certain nickel-based batteries without fully charging and discharging them can cause the formation of crystalline structures within the batteries. This phenomenon, known as "memory," decreases the ability of a battery to hold charge. A condition of low capacity caused by a memory effect can sometimes be cured by servicing the battery. Such servicing may involve fully discharging the battery and then fully recharging it.

Many businesses use significant numbers of rechargeable batteries. In such cases it can be difficult to keep track of which batteries are in need of replacing or servicing. There is a need for methods and apparatus for determining the states-of-health of rechargeable batteries. Such apparatus should be able to provide an assessment of the state-of-health of a battery quickly.

The state-of-health of a battery must be distinguished from the state-of-charge (SoC) and capacity of the same battery. Capacity is the maximum charge that the battery is capable of holding. The capacity of a properly functioning new battery is typically equal to or greater than the specified capacity published by its manufacturer. SoC is a measure of how much charge the battery is currently holding as compared to the battery's capacity. For example a battery having a capacity of 5.0 Ampere hours (Ah) which contains a charge of 2.5 Ah would have a SoC of 50%. State-of-health, by contrast, gives a more thorough picture of the overall condition of a battery by assessing how closely a battery meets its design specifications. For example, the battery referred to above would be considered to have a poor state-of-health if it had a specified capacity of 15 Ah. Assessing state-of-health however involves more than simply comparing a battery's current capacity with its specified capacity. For example, the battery referred to above would be considered to have a poor state-of-health if it had a specified capacity of 5.0 Ah, but had an undesirably high internal resistance.

One approach to measuring state-of-health quickly is to measure the internal resistance of a battery. In general, excessive internal resistance indicates that a battery is in poor shape. Internal resistance measurements take only a few seconds to complete and provide a reasonably accurate indication of a battery's condition, especially if a reference reading from a good battery is available for comparison. Unfortunately, internal resistance measurements alone can provide only a rough indication of a battery's state-of-health. Various battery conditions affect the internal resistance. For example, the internal resistance of a battery typically decreases for some time after the battery has been fully charged. After a few hours the internal resistance settles to a lower value. Temperature also affects internal resistance values. Many batteries contain protection circuits that further distort measured internal resistance values.

The problem of measuring the state-of-health of batteries is compounded by the fact that there are a very large number of different types of batteries. Each is designed to behave in a different manner. Rechargeable batteries may have any of a variety of battery chemistry types. Some common rechargeable batteries include: nickel cadmium (NiCd), nickel-metal hydride (NiMH), sealed lead acid (SLA), lithium ion (Li-ion) and lithium polymer (Li-polymer). Descriptions of various types of batteries can be found in *Handbook of Batteries*, 2nd ed. 1995, David Linden; McGraw-Hill, Inc. ISBN 070379211. Further, for each chemistry type, a variety of battery models are available from various manufacturers. Any system for measuring the state-of-health of a battery must take into account the specific type and model of battery in question.

Previous approaches to determining the health of batteries include smart batteries, battery monitoring systems which relate battery health to the internal impedance of the battery, and battery monitoring systems which relate battery health non-linearly to one or more electrochemical parameters of the battery.

Smart batteries are devices containing at least one battery integrated with a system for measuring the state-of-health or state-of-charge of that battery. Because the state-of-health measurement system is designed for use with a single specific battery the system does not need to be adaptable to different types of batteries. A smart battery typically includes provisions for monitoring electrical parameters such as voltage, current into the battery and current out of the battery. Smart batteries typically include a simple processor that applies predictive algorithms to estimate the battery's current state-of-charge. An example of a smart battery is described in U.S. Pat. No. 6,072,299. This patent describes a smart battery with maintenance and testing functions which maintains information related to the battery's need for maintenance and monitors conditions that indicate when the battery has reached the end of its useful life and should be discarded.

Smart batteries have several limitations. One limitation is that a system for measuring the battery's state-of-health must be integrated with each battery. This reduces the cost effectiveness of smart batteries. Further, to keep smart batteries cost effective the capabilities of the monitoring circuitry are generally limited. Such simplified circuits do not always provide reliable results.

Various stand-alone battery monitoring systems have been proposed. Some such systems measure the value of at least one electrochemical parameter of a battery as that battery ages. The way that the value(s) of the electrochemical parameter (or parameters) change with time is then related to the state-of-health of the battery. For example, U.S. Pat. No. 5,977,750 discloses a system for determining the health of a battery by tracking the degradation of the full charge capacity of a battery over time. As a further example, international patent publication WO 00/19578 discloses a battery monitoring system which computes intersections between temporal extrapolations of curves of internal resistance versus temperature with a predefined internal resistance versus temperature limit curve, thereby determining an expected useful life and hence the current state-of-health.

A disadvantage of such systems is that they require that periodic measurements take place as the battery degrades with age. A history of measurements of the relevant electrochemical parameters of the battery must accumulate before the degradation in those electrochemical parameters can be determined. Such battery monitoring systems cannot determine the state-of-health of a particular battery without having a history for that particular battery.

Some battery monitoring systems measure an internal impedance of the battery and attempt to relate battery health to the internal impedance. Such systems are described, for example, in Huet, *A review of impedance measurements for determination of the state-of-charge or state-of-health of secondary batteries*, Journal of Power Sources 70 (1998) 59–69. To date, such approaches have either not been as reliable as is desirable or have been undesirably complex and difficult to automate.

Some battery monitoring systems attempt to obtain more reliable indications of state-of-health by measuring a number of parameters and using a non-linear partial least squares analysis to identify a best fit between the measured electrochemical parameters of a battery and some mathematically defined state-of-health. For example, such an approach is described in Byers et al., *J. Electrochemical Soc.* 126 (1979) p. 720. The non-linear partial least squares analysis approach is undesirably computationally intensive. Further, using too few parameters provides insufficient data for proper correlation. Using too many parameters introduces noise. Either of these factors can severely hamper the reliability of a system based on performing least squares analysis.

In some prior battery monitoring systems, taking a measurement of a battery's state-of-health takes undesirably long. This is especially the case for systems which require that the battery under test be fully charged before a state-of-health measurement can be made.

There remains a need for a system for measuring the state-of-health of batteries which ameliorates disadvantages of the prior art. There is a particular need for such systems which can be adapted quickly to accommodate new types of battery. There is also a particular need for such systems which can quickly and reasonably reliably determine a battery's state-of-health.

SUMMARY OF THE INVENTION

This invention provides methods and apparatus for training fuzzy logic inference systems to produce outputs which indicate a characteristic of a test system in response to receiving a plurality of parameter values. The invention is described below using a battery testing system as an example. In this case the characteristic may be a state of health of a test battery and the parameter values may be the values of parameters such as voltages, currents, and times measured during the application of a current waveform to a test battery.

One aspect of the invention provides a method comprising:
a) providing a prototype set of fuzzy logic membership functions, the prototype set comprising a plurality of membership functions corresponding to each of the input parameters;
b) obtaining parameter values from a calibration system for which the characteristic has a known value;
c) for each of the parameter values obtained from the calibration system obtaining a system-specific set of fuzzy logic membership functions by scaling the corresponding plurality of membership functions; and,
d) using the system-specific set of membership functions to obtain outputs indicative of the characteristic of test systems.

Where the system comprises an electrochemical battery, the calibration system comprises a calibration battery, and the characteristic comprises a state of health of the battery, providing the prototype set of fuzzy logic membership functions may comprise determining a chemistry type of the battery and selecting from a plurality of prototype sets of fuzzy logic membership functions the prototype set of fuzzy logic membership functions which matches the chemistry type of the battery.

Another aspect of the invention provides an automatic battery testing method which comprises training a fuzzy logic battery analyzer for assessing the state-of-health of batteries of a known model and chemistry type, the method comprising:
a) providing a prototype set of prototype fuzzy logic membership functions which matches a chemistry type of a model of batteries to be tested;
b) measuring a capacity of a battery of the model of batteries to be tested which has a known state of health;
c) applying a current waveform to the battery and measuring a plurality of parameter values;
d) for each of the parameter values obtaining a model-specific set of fuzzy logic membership functions by scaling a corresponding plurality of membership functions in the prototype set; and,
e) using the model-specific set of membership functions in combination with a set of fuzzy logic rules to assess the states of health of one or more batteries to be tested.

Another aspect of the invention provides a method for training a system to produce an output indicative of a characteristic of a test system in response to a plurality of parameter values of the test system, the method comprising:
a) providing a prototype set, the prototype set comprising a plurality of functions, each one of the functions corresponding to a corresponding one of the parameters;
b) obtaining calibration parameter values from a calibration system for which the characteristic has a known value;
c) for each of the calibration parameter values obtained from the calibration system, obtaining a system-specific set of functions comprising a plurality of scaled functions obtained by scaling the corresponding plurality of functions; and
d) using the system-specific set of functions to produce the output.

Other aspects of the invention provide apparatus which may be used to perform methods according to the invention. The invention may be practised by providing a computer program product comprising computer-readable information which can be run on an automated testing apparatus, such as a programmable battery tester.

Further features and advantages of the invention are set out below.

BRIEF DESCRIPTION OF DRAWINGS

In drawings which illustrate non-limiting embodiments of the invention.

DESCRIPTION

Throughout the following description, specific details are set forth in order to provide a more thorough understanding of the invention. However, the invention may be practised without these particulars. In other instances, well known elements have not been shown or described in detail to avoid unnecessarily obscuring the invention. Accordingly, the specification and drawings are to be regarded in an illustrative, rather than a restrictive, sense.

The invention is described in the following description as being applied to assessing the state-of-health of batteries. Those skilled in the art will understand that the methods and apparatus disclosed herein could also be applied more generally to the determination of output values which are fuzzy logic functions of a plurality of input values.

Figure 1:
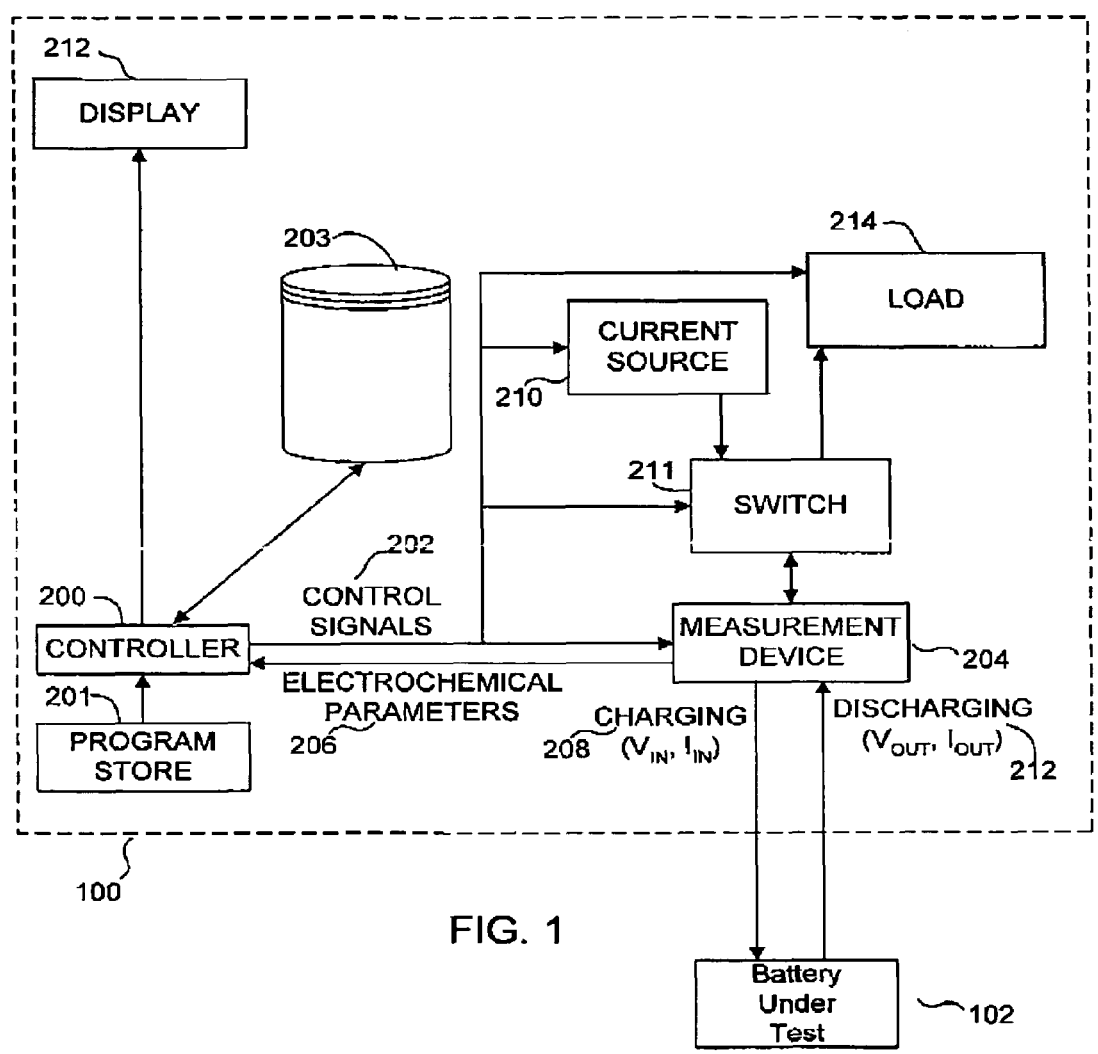
FIG. 1 is a block diagram of an apparatus according to a preferred embodiment of the invention.

FIG. 1 is a block diagram of a battery analyzer 100 according to a preferred embodiment of the invention. Battery analyzer 100 comprises a means for applying a current waveform to a battery under test, a measuring means for measuring electrochemical parameters of the battery under test and an analysis means for deriving an estimate of a state-of-health of the battery from electrochemical parameter values measured by the measuring means. Battery analyzer 100 is connected to a battery under test 102. Preferably battery analyzer 100 begins by measuring the state-of-charge (SoC) of battery 102. State-of-health (SoH) testing is best performed when the battery under test is neither fully charged nor fully discharged. A rudimentary SoC determination may comprise measuring the battery's open-circuit voltage. If analyzer 100 determines that the SoC of battery 102 is not appropriate for SoH determination then analyzer 100 either charges or discharges battery 102 to correct this situation.

A time-varying current waveform is applied to battery 102 via a measurement device 204 operating under control of a controller 200. An example of a possible current waveform 230 is depicted by its corresponding voltage waveform in FIG. 2. The particular mechanism by which the current waveform is generated is not important to this invention. Those skilled in the art are aware of a wide variety of suitable means for applying a current waveform to a battery under test including many such means which are described in the worldwide patent literature. In the illustrated embodiment, either a current source 210 or a load 214 can be connected to battery 102 by a switch 211. A controller 200 generates and sends control signals 202 which set switch 211, current source 210 and load 214 as appropriate to apply the desired current waveform to battery 102.

Controller 200 may comprise a general purpose computer, microcontroller, or the like and an associated program store 201 containing software instructions which, when executed by controller 200 cause controller 200 to operate as described herein. In the alternative, controller 200 may comprise a field programmable gate array (FPGA), application specific integrated circuit, or the like configured to execute methods according to the invention.

As the current waveform is being delivered to battery 102, control signals 202 cause measurement device 204 to take measurements of electrochemical parameters of battery 102 and to convey those electrochemical parameters 206 to controller 200 in the form of digitized signals. Neither the particular construction of measurement device 204 nor the way in which electrochemical parameters 206 are conveyed to controller 200 are important to the invention. Those skilled in the art are aware of a wide variety of suitable means for obtaining electrochemical parameters of a battery under test including many such means which are described in the worldwide patent literature.

Controller 200 computes and displays on a display 212 and/or stores in a data store 203 associated with controller 200, an assessment of a SoH of battery 102. The assessed SoH is derived from the values of the electrochemical parameters 206. In a preferred embodiment, the electrochemical parameters 206 that are measured by battery analyzer 100 include:

- internal resistance of battery 102;
- voltage at output of battery 102, after charging, with no load;
- voltage at output of battery 102, after charging, with a load applied;
- open circuit voltage of battery 102; and,
- times which elapse between various events which occur during the measurement procedure.

Figure 2:
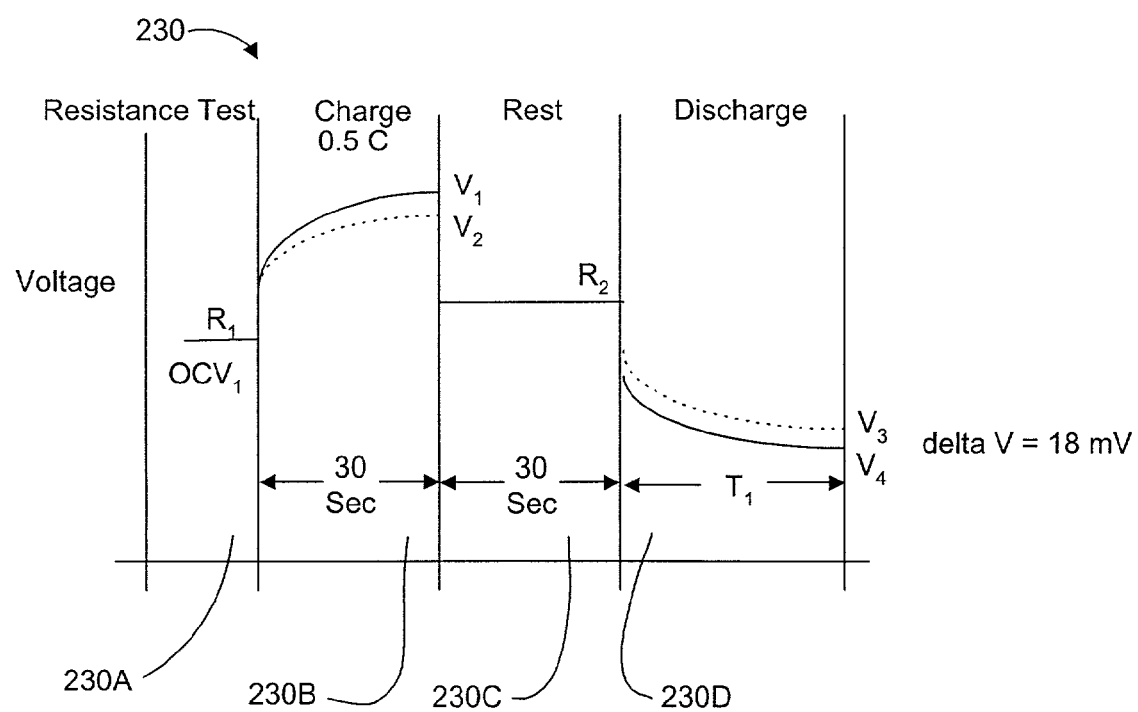
FIG. 2 is a plot of current as a function of time for a possible current waveform for use in the invention.

By way of example, measurement device 204 might apply the waveform of FIG. 2 to battery 102 to obtain a set of electrochemical parameters 206 which can be used to assess the SoH of battery 102. Different protocols for obtaining electrochemical parameters may be used for different battery types and models. The protocol may be specified for each battery by a c-code which specifies a set of factors which permit an appropriate test sequence to be established. The c-code may specify, for example, chemistry, voltage rating, capacity and other information about the model of battery being tested.

The example current waveform 230 comprises a resistance test portion 230A, an charge portion 230B, a rest portion 230C and a discharge portion 230D. During resistance test portion 230A, measurement device 204 measures the internal resistance R1 and open-circuit output voltage OCV1. R1 and OCV1 may be used to determine if battery 102 is suitable for further testing. If the values of R1 and OCV1 are within acceptable ranges, the method of this invention proceeds to charge portion 230B. During charge portion 230B, battery 102 is charged with current supplied by current source 210 at a specified rate. For example, the charging rate might be 0.5×C, where C is the capacity of battery 102 (e.g. if battery 102 has a capacity of 2 Ah then, during charge portion 230B, battery 102 is charged at a rate of 1 Ampere). Preferably the charging rate is specified for each model of battery to be tested. In any case, the charging rate used must not damage battery 102. Charge portion 230B preferably comprises a series of pulses. If the battery under test is a nickel-based battery, then, during each pulse, battery 102 is discharged (e.g. connected to a load) for a short period, and charged for a short period. If the battery under test is a lead-based or lithium-based battery, then, during each pulse, battery 102 is rested for a short period, and charged for a short period. Battery 102 is allowed to rest for a short period between periods when it is being charged or discharged.

During the last charge pulse of charge portion 230B, measurement device 204 measures voltage V1, which is the voltage of battery 102 when it is not under load and voltage V2, which is the voltage of battery 102 when it is under load. In the preferred embodiment of the invention, controller 200 bases its SoH determination, in part, on the difference, DV1, between V1 and V2. After rest portion 230C, measurement device 204 measures the internal resistance R2 of battery 102.

During discharge portion 230D, battery 102 is discharged at a specified rate. Discharge portion 230D preferably comprises a series of pulses. During each pulse, battery 102 is discharged for a short period. This may be accomplished by controlling switch 211 to briefly connect battery 102 to load 214. Load 214 is preferably a resistive load. During each pulse, battery 102 is allowed to rest for a short period. In the preferred embodiment of the invention, in each discharge pulse, measurement device 204 measures a voltage V3 of battery 102 when battery 102 is not under load and a voltage V4 of battery 102 when battery 102 is under load. Most preferably, discharge portion 230D continues for a minimum specified time (for example 15 seconds) before the difference between V3 and V4 is measured. Discharge portion 230D continues until the difference between V3 and V4 reaches a threshold value. Preferably the threshold value is specified for each model of battery to be tested. For example, the threshold value may be 6 mV/cell for NiCd, NiMH and SLA battery types, and may be 18 mV/cell for Li-ion and Li-polymer battery types. The time T1 which has elapsed since the start of discharge portion 230D is measured. At the end of discharge portion 230D, the two voltages V3 and V4 are also measured. In the preferred embodiment of the invention, controller 200 bases its SoH determination, in part, on the difference, DV2, between V3 and V4.

After current waveform 230 has been applied to battery 102, controller 200 processes the set of electrochemical parameters 206 for battery 102 which was collected by measurement device 204. In the preferred embodiment, the set of electrochemical parameters 206 includes at least R2, V1, V2, DV1, V3, V4 DV2 and T1. Controller 200 uses these parameters to derive and convey to a user an assessment of the SoH of battery 102. It will be appreciated that the basic methods and apparatus of this invention can be applied in situations where different sets of electrochemical parameters are measured. Further, the mechanism by which the electrochemical parameters are measured does not affect the operation of assessing the battery's SoH. All that is required is some measuring means for measuring a set of electrochemical parameters of a battery which is sufficient to characterize the SoH of the battery. The measuring means is preferably software configurable. In the embodiment illustrated in FIG. 1, the measuring means comprises measurement device 204, current source 210, switch 211, load 214, and the software instructions which cause controller 200 to generate the control signals 202 which cause the set of electrochemical parameters to be measured.

Figure 3:
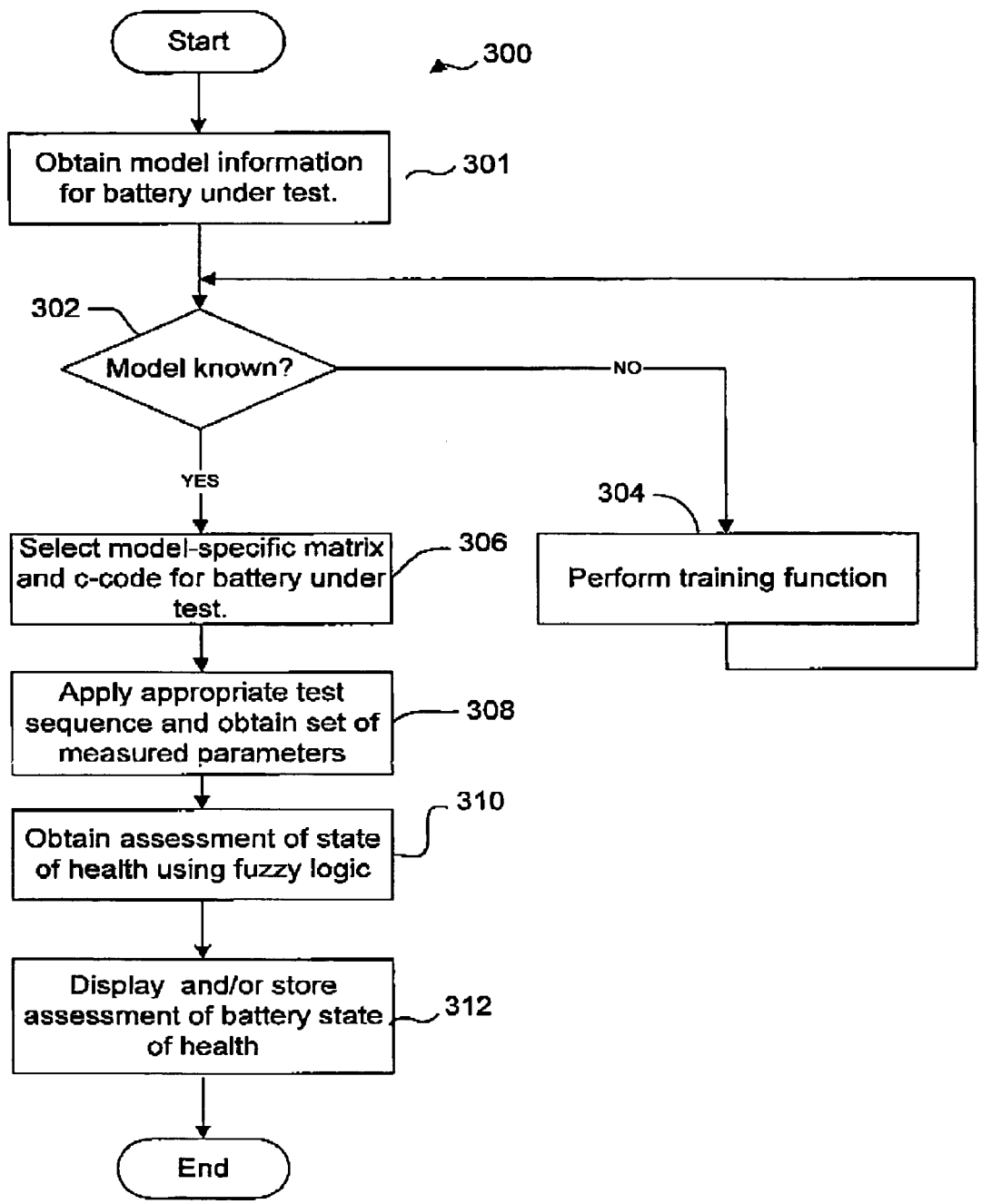
FIG. 3 is a flowchart illustrating a fuzzy logic method for determining the state-of-health of a battery under test.

Controller 200 implements a fuzzy logic system for obtaining an assessment of the SoH of battery 102. FIG. 3 illustrates a method 300 to obtain such an assessment according to the invention. Method 300 determines in block 301 the model of battery 102. Model identification information may be obtained, for example, by way of a suitable user input 201. If the model is not known to apparatus 100, as determined at block 302, then a training function is performed (block 304). The training function is described below. If block 302 determines from the model identification information that the model is known to apparatus 100 then the model identification information is used to look up information regarding the battery's electrical characteristics (e.g. a configuration code) and a set of information which determines how the SoH is related to the measured electrochemical parameters. This set of information may be called a "model-specific matrix" appropriate to the model of battery 102. The c-code and model-specific matrix may be stored in a data storage device, such as a RAM, ROM, flash RAM, hard disk, or the like.

In block 308 a test sequence which suits the c-code identified in block 306 is applied to the battery to obtain a set of measured electrochemical parameters 206. Block 308 may be carried out as described above, for example. In block 310 an assessment of the battery's SoH is obtained by applying fuzzy logic rules to the set of measured parameters. In block 312 the assessment is displayed and/or stored for later use.

Figure 4:
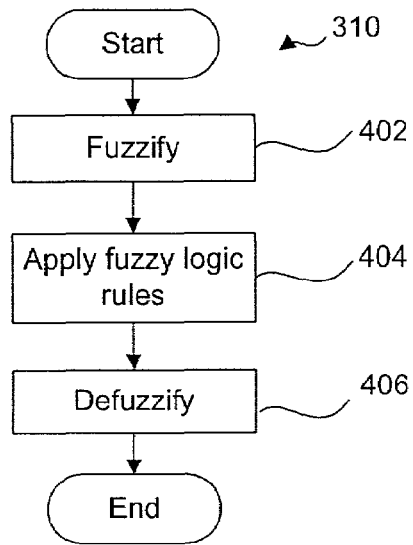
FIG. 4 is a flowchart illustrating a fuzzy logic method for computing the state-of-health of a battery under test in accordance with its model type.

Block 310 is performed as illustrated in FIG. 4. To derive an assessment of the SoH of battery 102, the set of measured electrochemical parameters is fuzzified (block 402). Fuzzification involves using the measured values of the electrochemical parameters 206 for battery 102 to determine antecedent membership values in a number of fuzzy sets.

Fuzzy sets are generalizations of conventional sets. In conventional set theory, a given item is either a member of a set or is not a member of the set. When using fuzzy logic an item may have fractional membership in a set as determined by a membership function for the set. The principles of fuzzy logic are now well understood to those skilled in the art and will not be repeated here. Various textbooks on the topic of fuzzy logic have been published including Ross, *Fuzzy Logic With Engineering Applications*, McGraw Hill, 1995 and Kosko, *Fuzzy Engineering*, Prentice Hall, 1997 which are hereby incorporated herein by reference.

In the preferred embodiment of this invention, for each electrochemical parameter 206 in the set, the value of the electrochemical parameter 206 is used to compute the membership of that electrochemical parameter in a fuzzy set associated with each one of a number of possible outcomes. For example, where there are three outcomes, such as "excellent", "good" and "poor", fuzzification comprises computing the values of three membership functions for each parameter in the set. Each membership function yields a value in the range of 0 to 1 where 1 indicates full membership in the fuzzy set associated with the membership function and 0 indicates no membership at all. More or fewer membership functions may be associated with each parameter. In general, the number of membership functions associated with each parameter may be different.

Figure 5A:
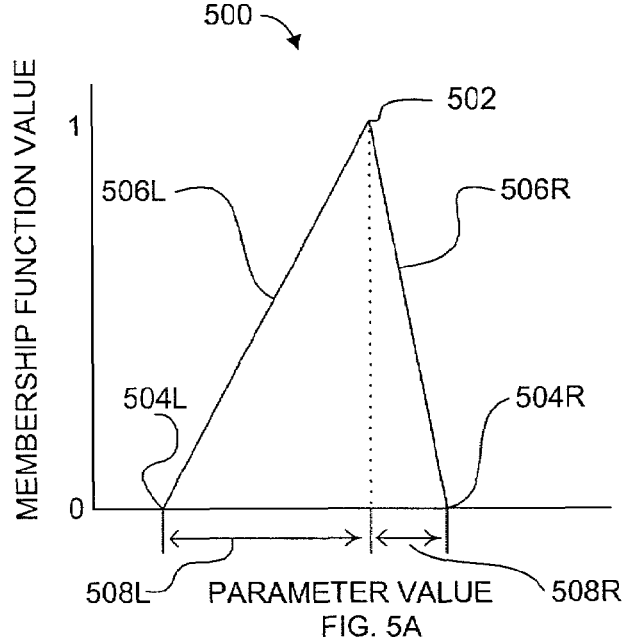
FIG. 5A is a graphical representation of an example fuzzy logic membership function.

The membership functions may take various forms. Gaussian fuzzy logic membership functions most realistically model natural behaviour, but necessitate extensive computation. In the preferred embodiment of this invention, each of the membership functions is a triangular function as shown in FIG. 5A. Function 500 has a peak 502, and left and right points of intersection with the abscissa 504L and 504R. Function 500 has left and right linear segments 506L and 506R each having a slope. Function 500 has a low region 508L in which the parameter has a value between that of points 504L and 502 and a high region 508R between point 502 and point 504R. Such a triangular membership function can be completely specified by three numbers. For example, the function of FIG. 5A can be completely specified by providing the parameter values corresponding to each of points 504L, 504R and 502. Equivalently, the function can be specified by the slopes of segments 506L and 506R and the parameter value corresponding to peak 502.

Figure 5B:
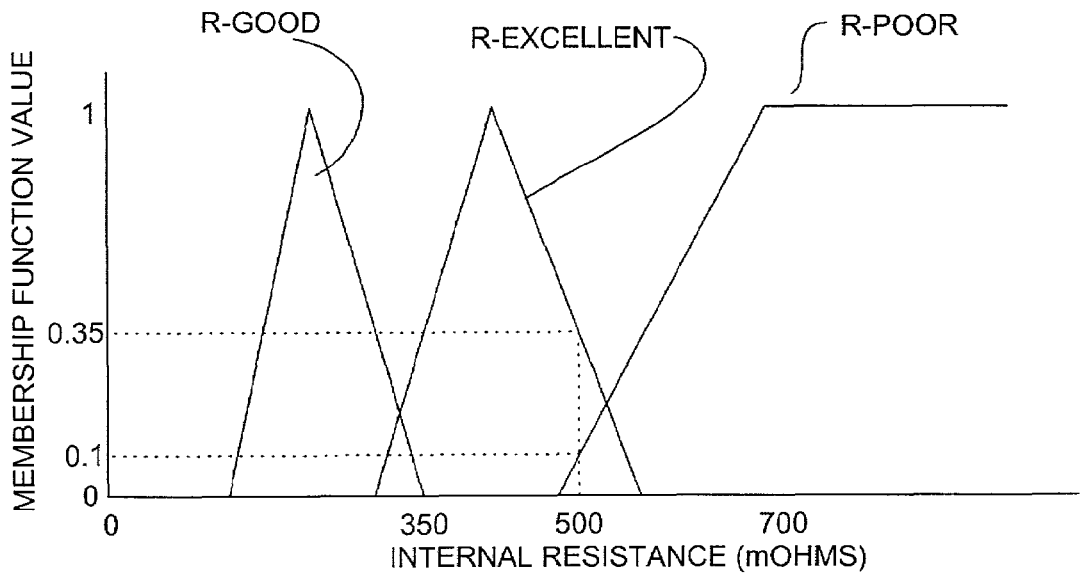
FIG. 5B is a graphical representation of a set of three exemplary fuzzy logic membership functions for use in fuzzification of a resistance parameter.

FIG. 5B shows an example set of membership functions for internal resistance for a specific battery. It can be seen that the membership functions are not symmetrical and can overlap with one another. The dotted lines in FIG. 5B demonstrate that a battery having an internal resistance of 500 mΩ has an antecedent membership value of 0 in the set named "R-good", about 0.35 in the set named "R-excellent" and about 0.1 in the set named "R-poor". These values indicate the degree to which the internal resistance of battery 102 belongs to each of these fuzzy sets.

As illustrated by the "R-poor" membership function of FIG. 5B, a trapezoidal membership function is a special case of a triangular membership function wherein one of the left and right points 506L, 506R, is located on the abscissa at a parameter value of "infinity".

The results of fuzzification block 402 may be represented by a working matrix as shown in Table I. The working matrix of Table I includes example antecedent membership values. Of course, the results of fuzzification may be held in any suitable data structure or structures.

TABLE I

Example Antecedent Membership Values

| Parameters ↓ | Set → | | |
| --- | --- | --- | --- |
| | Excellent (j = 0) | Good (j = 1) | Poor (j = 2) |
| R (i = 0) | 0.7 | 0.6 | 0.2 |
| DV1 (i = 1) | 0.5 | 0.8 | 0.3 |
| DV2 (i = 2) | 0.35 | 0.55 | 0.65 |
| T (i = 3) | 0.25 | 0.45 | 0.85 |

The particular membership functions to be used for a battery depend upon the type and model of battery being tested. Definitions for the fuzzy logic membership functions for use with a specific model of battery can be conveniently stored in a model-specific matrix as selected in block 306. TABLE II shows an example format for a model-specific matrix. The information in the model-specific matrix may be held in any suitable data structure or data structures.

TABLE II

Example model-specific matrix

| Battery model | | NiMH Standard | | |
| --- | --- | --- | --- | --- |
| Name of fuzzy set | Row | parameter value at point 504L | parameter value at point 502 | parameter value at point 504R |
| R-excellent | 2 | 300 mΩ | 450 mΩ | 600 mΩ |
| R-good | 3 | 150 mΩ | 270 mΩ | 350 mΩ |
| R-poor | 4 | 560 mΩ | 700 mΩ | 'infinity' |
| $DV_1$-excellent | 5 | 65 mV | 96 mV | 120 mV |
| $DV_1$-good | 6 | 10 mV | 56 mV | 75 mV |
| $DV_1$-poor | 7 | 120 mV | 144 mV | 'infinity' |
| $DV_2$-excellent | 8 | 75 mV | 123 mV | 160 mV |
| $DV_2$-good | 9 | 30 mV | 66 mV | 80 mV |
| $DV_2$-poor | 10 | 100 mV | 187 mV | 'infinity' |
| T-excellent | 11 | 74 ms | 80 ms | 'infinity' |
| T-good | 12 | 73 ms | 78 ms | 80 ms |
| T-poor | 13 | 0 ms | 73 ms | 75 ms |
| excellent | 14 | 80% | 100% | 110% |
| good | 15 | 70% | 75% | 80% |
| poor | 16 | 50% | 60% | 70% |

It can be seen that the model-specific matrix of Table II stores information about the model of the battery associated with the model-specific matrix; information specifying membership functions corresponding to each parameter in the set of parameters used to assess battery SoH (in the example of Table II there are 12 membership functions, with three membership functions for each of four parameters); and information which specifies defuzzification membership functions as described below (in the example there are three defuzzification membership functions). Preferably the model-specific matrix also stores a charging rate to be applied during the charge portion 230B and a threshold value and discharging rate to be applied during the discharge portion 230D discussed above. Preferably the model-specific matrix also stores the values of calibration counters and an epoch counter as described below. Each of the membership functions is defined by values located in one of rows 2 to 13 of the matrix. It will be apparent to those skilled in the art that the information displayed in Tables I and II need not be arranged in the form of matrices, but any data structures suitable for use by controller 200, for example, linked lists or the like, may be used.

Figure 6:
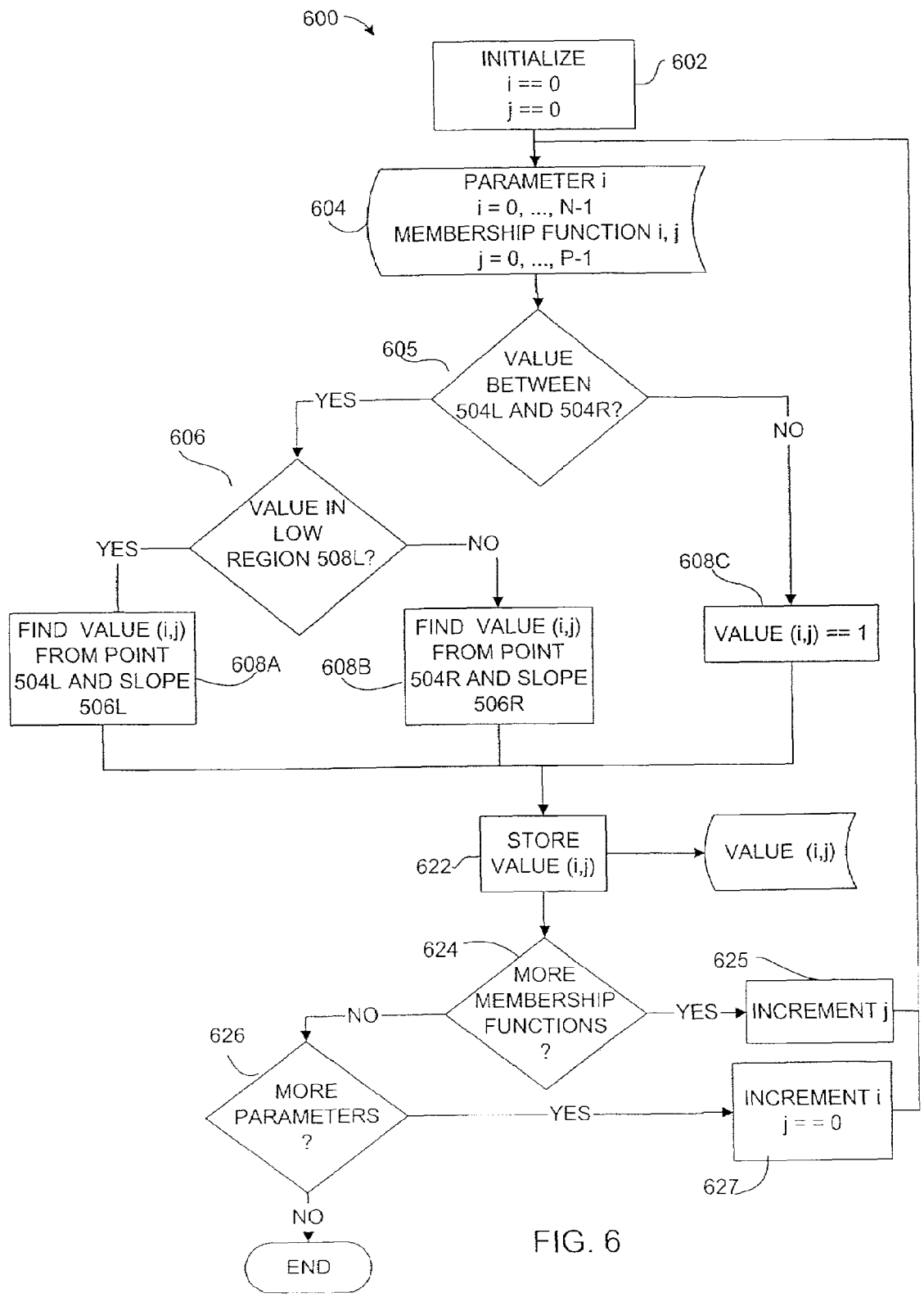
FIG. 6 is a flowchart illustrating a method for efficiently fuzzifying parameter values.

FIG. 6 illustrates one method 600 for efficiently obtaining the antecedent membership values for a number, N, of parameters each having a number, P, of corresponding fuzzy sets. After initialization in block 602, the first parameter value and the first membership function for the first parameter value are provided in block 604. In block 605, the first parameter value is compared to the parameter values for points 504L and 504R from the model-specific matrix to determine whether the parameter value lies within region 508L or 508R. If not, then the antecedent membership value for the first membership function and first parameter is set to 1 in block 608C, indicating that the first parameter does not fall within the first membership function at all. An antecedent membership value of 1 will not affect later computations because, as explained below, the computations of block 404 use a minimum function unaffected by an antecedent membership value at its maximum value of 1. If the first parameter value falls within the range of the first membership function, then, in block 606, the first parameter value is compared to the parameter values for points 504L and 502 from the model-specific matrix to determine whether the parameter value lies within region 508L. If so, then in block 608A the antecedent membership value for the first membership function and first parameter is determined from the first parameter value, from the point 504L and from the slope 506L of the membership function in region 508L. If the first parameter value is not within region 508L, but in region 508R instead, then in block 608B the antecedent membership value for the first membership function and first parameter is determined from the first parameter value, from the point 504R and from the slope 506R of the membership function in region 508R.

In block 622, the resulting value is stored in a suitable data structure which could, for example, be an array having the general format of Table I. If block 624 determines that there are more membership functions to be evaluated for the current parameter value then the counter j is incremented in block 625 and the process is repeated until all membership functions for the current parameter value have been evaluated.

If block 624 determines that there are no more membership functions to be evaluated for the current parameter value then method 600 continues to block 626 where it is determined whether there are more parameter values to be processed. If so, the counter I is incremented and the counter j is reinitialized to 0 in block 627 and the process is repeated for the membership functions for the next parameter value. After all membership functions for all parameter values have been evaluated then the fuzzification process ends.

Although not shown in FIGS. 5A, 5B and 6, if an antecedent membership value is determined by the method of FIG. 6 to be below some minimum threshold, then a small, non-zero antecedent membership value such as 0.01 can be stored by block 622. A small, non-zero antecedent membership value avoids mathematical difficulties which could be caused by the value zero without introducing significant error into the computations.

Those skilled in the art will appreciate that each of the antecedent membership values can be calculated independently of any of the other antecedent membership values. The antecedent membership values can therefore be calculated in any order or even simultaneously. The method 600 illustrated in FIG. 6 is merely an illustration of one possible way to perform fuzzification.

As indicated by block 404, an assessment of the overall SoH of battery 102 is obtained by applying a set of fuzzy logic rules to the antecedent membership values resulting from the fuzzification performed in block 402. The fuzzy logic rules derive consequent membership values from the antecedent membership values obtained in block 402. In the preferred embodiment described herein, there is a fuzzy logic rule for every possible combination of memberships of electrochemical parameters 206 in the set of outcomes. For example, where there are four parameters, each having potential for membership in three fuzzy sets there are $3^4=81$ rules.

In the preferred embodiment, each rule is of the form: "IF (Parameter$_1$ is in SET(1, $k_1$)) and (Parameter$_2$ is in SET(2, $k_2$)) . . . and (PARAMETER$_N$ is in set (N, $k_N$)) THEN Consequence$_R$". $k_i$ are indices which can range over the P fuzzy sets corresponding to the outcomes associated with each parameter. Each rule has a different set of $k_i$. The correspondence between the outcomes and the integer values of $k_i$ are such that the outcomes are ordered according to their respective contributions to SoH. For example, where there are three fuzzy sets associated with each parameter (i.e. P=3), $k_i$ can each be an integer in the range of 0 to 2, with $k_i=0$ corresponding to the outcome "excellent," $k_i=1$ corresponding to the outcome "good" and $k_i=2$ corresponding to the outcome "poor."

Where Parameter$_1$ is R, Parameter$_2$ is DV1, Parameter$_3$ is DV2, Parameter$_4$ is T and each parameter determines membership in sets associated with the outcomes "excellent," "good" and "poor" then the rules may be expressed in the form:

RULE 1: If R is "excellent" and DV1 is "excellent" and DV2 is "excellent" and T is "excellent", then C1.

RULE 2: If R is "excellent" and DV1 is "excellent" and DV2 is "excellent" and T is "good", then C2.

RULE 3: If R is "excellent" and DV1 is "excellent" and DV2 is "excellent" and T is "poor", then C3.

RULE 4: If R is "excellent" and DV1 is "excellent" and DV2 is "good" and T is "excellent", then C4.

. . .

RULE 80: If R is "poor" and DV1 is "poor" and DV2 is "poor" and T is "good", then C80.

RULE 81: If R is "poor" and DV1 is "poor" and DV2 is "poor" and T is "poor", then C81.

C1 to C81 are consequent membership values. C1 to C81 are computed as the minimum value of the four antecedent membership values considered by the corresponding fuzzy logic rule. Thus, for example, RULE 1 may be restated as follows:

RULE 1: C1=the minimum of:
 the membership value of R in "excellent,"
 the membership value of DV1 in "excellent,"
 the membership value of DV2 in "excellent," and,
 the membership value of T in "excellent."

The consequent membership values are then defuzzified (block 406 in FIG. 4) to yield an assessment of the SoH of battery 102. Defuzzification is performed by deriving from the consequent membership values a centroid of weights where each weight is computed as an area in a defuzzification membership function associated with the rule that generated the consequent membership value in question.

To associate each rule with a defuzzification membership function, the values of $k_i$ may be used to assign each rule to a group and each group may be associated with a defuzzification membership function. In the preferred embodiment, the group to which a rule belongs is identified by summing the $k_i$ which define the rule. In the example embodiment being described herein, there is one rule for which $\Sigma k_i=0$, four rules for which $\Sigma k_i=1$, ten rules for which $\Sigma k_i=2$, sixteen rules for which $\Sigma k_i=3$, nineteen rules for which $\Sigma k_i=4$, sixteen rules for which $\Sigma k_i=5$, ten rules for which $\Sigma k_i=6$, four rules for which $\Sigma k_i=7$ and one rule for which $\Sigma k_i=8$.

In the preferred embodiment described above there are nine groups each having a distinct value $\Sigma k_i$. In general the number of groups will be the number of distinct values for $\Sigma k_i$. Expressed mathematically, $$\text{Number of Groups}=N*(P-1)+1 \quad (1)$$

where N is the number of parameters and P is the number of corresponding fuzzy sets. For example, there will be 11 groups in the case where there are 5 parameters and 3 corresponding outcomes for each parameter.

Each group of rules may be associated with a definitional consequent membership value. Preferably, the definitional consequent membership values are monotonically ordered and fully cover a desired range of output values. Preferably definitional consequent membership values are equally spaced throughout the range, though a non-uniformly spaced set may be used without departing from the spirit of the invention. Preferably the correspondence between the group of rules and the definitional consequent membership values are such that the contribution of each group of rules to SoH is consistent with the definitional consequent membership values.

Figure 7:
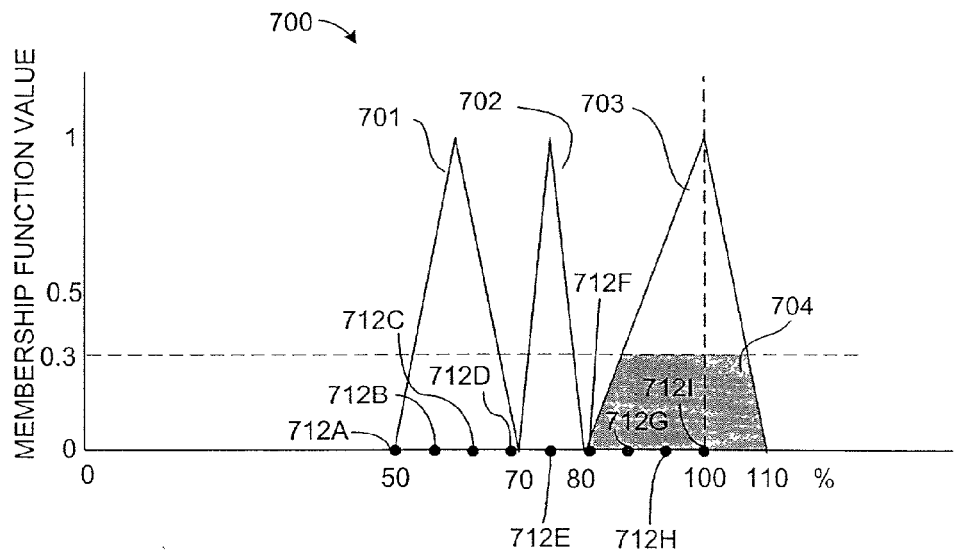
FIG. 7 is a graphical representation of a set of three exemplary fuzzy logic membership functions for use in defuzzification.

In the preferred embodiment described herein, each group of rules corresponds to one of the definitional consequent membership values in a monotonically ordered set throughout the desired range of output values front 50 to 100%. This set of definitional consequent membership values {50, 56.25, 62.5, 68.75, 75, 81.25, 87.5, 93.75, 100} is shown as definitional consequent membership values 712A through 712I in FIG. 7.

In the preferred embodiment described herein, each definitional consequent membership value is associated with an outcome defined by defuzzification membership functions. For example, rows 14, 15 and 16 of Table II, shown in FIG. 7, define defuzzification membership functions corresponding to the outcomes "excellent," "good" and "poor." Preferably, the defuzzification membership functions do not overlap. The outcome associated with a group of rules is the outcome for which the definitional consequent membership value falls between the upper and lower values of SoH defining the corresponding defuzzification membership function.

Table III shows example defuzzification associations between the groups of rules defined by $\Sigma k_i$, the definitional consequent membership values and the outcomes defined by the defuzzification membership functions of rows 14, 15 and 16 of Table II.

TABLE III

Example Defuzzification Associations

| $\Sigma k_i$ | Definitional Consequent Membership Value (%) | Outcome |
| --- | --- | --- |
| 0 | 100 | excellent |
| 1 | 93.75 | excellent |
| 2 | 87.5 | excellent |
| 3 | 81.25 | excellent |
| 4 | 75 | good |
| 5 | 68.75 | poor |
| 6 | 62.5 | poor |
| 7 | 56.25 | poor |
| 8 | 50 | poor |

For example, in the preferred embodiment described herein, the $k_i$ values corresponding to RULE 2 are 0, 0, 0 and 1 so that $\Sigma k_i=1$. RULE 2 is therefore associated with the definitional consequent membership value 93.75. The definitional consequent membership value is associated with the outcome "excellent" because 93.75 falls between the values 80 and 110 of row 14 of Table II. (See also membership function 703 of FIG. 7.) Thus, for defuzzification purposes, RULE 2 is associated with the outcome "excellent."

The consequent membership value that results from applying a rule defines a trapezoid in the membership function that corresponds to the outcome associated with that rule. For example, consider a battery for which RULE1 produces a consequent membership value of 0.3. For RULE 1, $\Sigma k_i=0$, and so RULE 1 belongs to the group associated with the definitional consequent membership value 100%. As indicated by the vertical dotted line in FIG. 7, 100% corresponds to membership function 703 which corresponds to the outcome "excellent". The consequent membership value of 0.3 defines a trapezoidal region 704 within function 703. The area of region 704 can be considered to be a weight, associated with the consequent membership value of 0.3, to be assigned to the rule.

Defuzzification (block 406) can be performed, for example, by the center of maximum (CoM) or center of area (CoA) methods. Where the CoA method is used, defuzzification involves identifying and computing the areas of the trapezoidal regions identified by each of the rules, summing the results for each of the groups of rules and then computing a centroid to yield an assessed SoH for battery 102.

The centroid may be computed using the equation:

$$SoH = \frac{\sum_{groups} x_i w_i}{\sum_{groups} w_i} \qquad (2)$$

where: $x_i$ is the definitional consequent membership value associated with the $i^{th}$ group of rules, and $w_i$ is the total weight computed from the consequent membership values of the $i^{th}$ group of rules.

The value SoH is an assessment of the SoH of battery 102. In some cases it can be undesirably misleading to present to a user a seemingly "precise" value for SoH. In such cases it can be desirable to display to the user an assessment of SoH which describes the SoH of battery 102 in words. For example, the battery might be described as being one of "excellent," "good", "fair" or "poor."

Because the fuzzy logic membership functions, exemplified in FIG. 5B, are specific to a given battery model, a set of fuzzy logic membership functions must be provided for each model of battery to be tested. The specific membership functions which will result in a reliable indication of the SoH for a battery is arrived at empirically through experimentation and analysis. Such sets may be stored as model-specific matrices as described above with reference to Table II.

There will be many cases, however, where a battery must be tested which is not known to apparatus 100. To deal with this situation, this invention provides a novel adaptive system which can be used to generate model-specific matrices for batteries of types new to apparatus 100. The adaptive system includes one or more prototype matrices, each of which specifies a prototypical set of membership functions. Each prototype matrix illustrates the general degradation trend of a type of battery based upon the chemistry of the corresponding battery type. Apparatus 100 may include prototype matrices for one or more different types of battery. The adaptive system performs a method in which it creates a model-specific matrix by modifying an appropriate prototype matrix.

Figure 8:
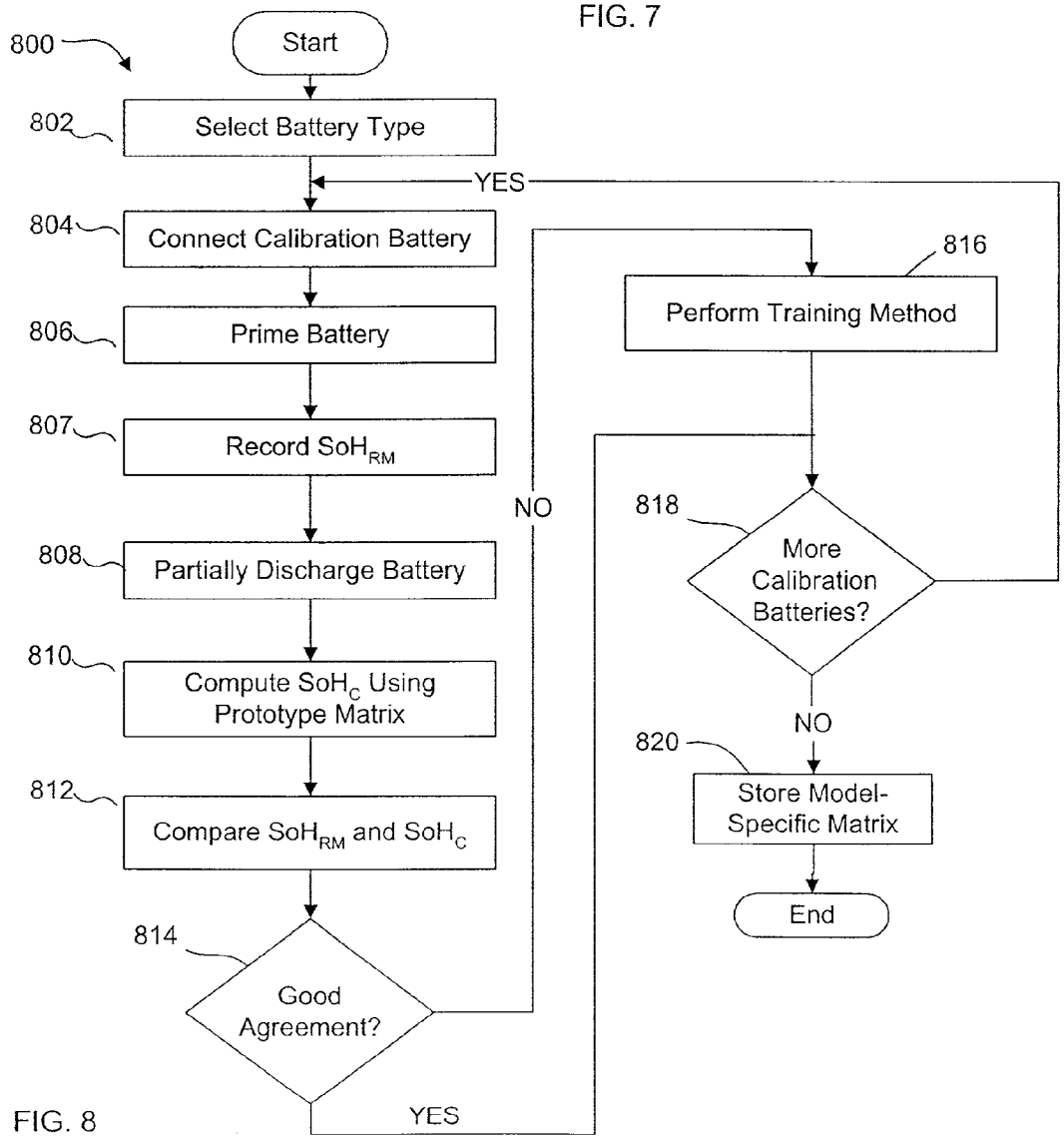
FIG. 8 is a flowchart illustrating a training method that uses a calibration battery to create and optimize a model-specific matrix for use with a new model of battery.

The adaptive system may comprise software which runs on controller 200. FIG. 8 illustrates a training method 800 according to the invention. Method 800 begins by selecting a battery type (e.g. NiCd) (block 802) and connecting a calibration battery of the selected type to apparatus 100 (block 804).

The calibration battery is then primed (block 806). Priming repeatedly cycles the calibration battery until its maximum capacity is reached. While priming is fairly time consuming it permits the capacity of the calibration battery to be reliably assessed. The capacity of the battery can be determined by charging the battery and then timing the discharge of the battery. The actual SoH is assumed to be directly related to the battery's capacity. Preferably the first calibration battery is a brand new battery which can be assumed to have a SoH of 100%. The SoH of other calibration batteries having different capacities can then be determined as follows:

$$SoH_{RM} = \frac{C_{RM}}{C_{BM}} \times 100\% \tag{3}$$

where $C_{RM}$ is the reliably measured capacity of a calibration battery, and $C_{BM}$ is the reliably measured capacity of a new calibration battery which is assumed to have a SoH of 100%. $C_{BM}$ may be called a "benchmark capacity".

The reliably-measured state-of-health ($SoH_{RM}$) is then recorded in block 807. In an alternative embodiment of the invention where the user accurately knows the SoH of the calibration battery by some other means, computation of the SoH for the calibration battery may be foregone and the known SoH may be simply recorded at block 807 as input from the user. After recording the reliably-measured $SoH_{RM}$, the calibration battery is partially discharged (block 808) so that the battery is operating in a state that is neither fully charged nor discharged. The battery is preferably allowed to rest, for example for ½ hour before continuing.

A current waveform, which is preferably the same as current waveform 230 described above, is then applied to the calibration battery, the fuzzy membership functions defined in a prototype matrix associated with the battery type identified in block 802 are then used as described above to compute a SoH for the battery (block 810). In block 812, the computed SoH is compared to the reliably-measured $SoH_{RM}$ recorded at block 807. If these values agree to within a threshold (for example 2%) then no optimization is necessary in respect of the current calibration battery (block 814).

If block 814 determines that the computed SoH and reliably-measured $SoH_{RM}$ values do not match, then block 816, which is described below, adjusts the prototype matrix in a way that attempts to minimize the difference between the reliably-measured $SoH_{RM}$ recorded in block 807 and the SoH computed in block 810. Different membership functions are adjusted depending upon the $SoH_{RM}$ of the calibration battery. As indicated by block 818, the preceding parts of method 800 may be repeated, preferably using calibration batteries that have different states-of-health. The modified prototype matrix is saved as a model-specific matrix in block 820.

Preferably the model-specific matrix shown in Table II also stores the values of calibration counters and an epoch counter. Table IIIa is an example of stored values of calibration counters and an epoch counter.

TABLE IIIa

Example Calibration and Epoch Counters

| Calibration Category q | Calibration Counter $c_q$ |
| --- | --- |
| 1 | 1 |
| 2 | 0 |
| 3 | 0 |

TABLE IIIa-continued

Example Calibration and Epoch Counters

| Calibration Category q | Calibration Counter $c_q$ |
| --- | --- |
| 4 | 1 |
| 5 | 0 |
| 6 | 0 |
| 7 | 0 |
| 8 | 1 |
| Epoch Counter | 3 |

Each calibration counter $c_q$ records the number of training cycles (block 816) completed using a calibration battery of the associated calibration category q. The epoch counter is the sum of the calibration counters and tracks the total number of training cycles completed for the particular model of battery 102. The calibration counter $c_q$ and the epoch counter are updated in block 918 of FIG. 9, as described below.

Figure 9:
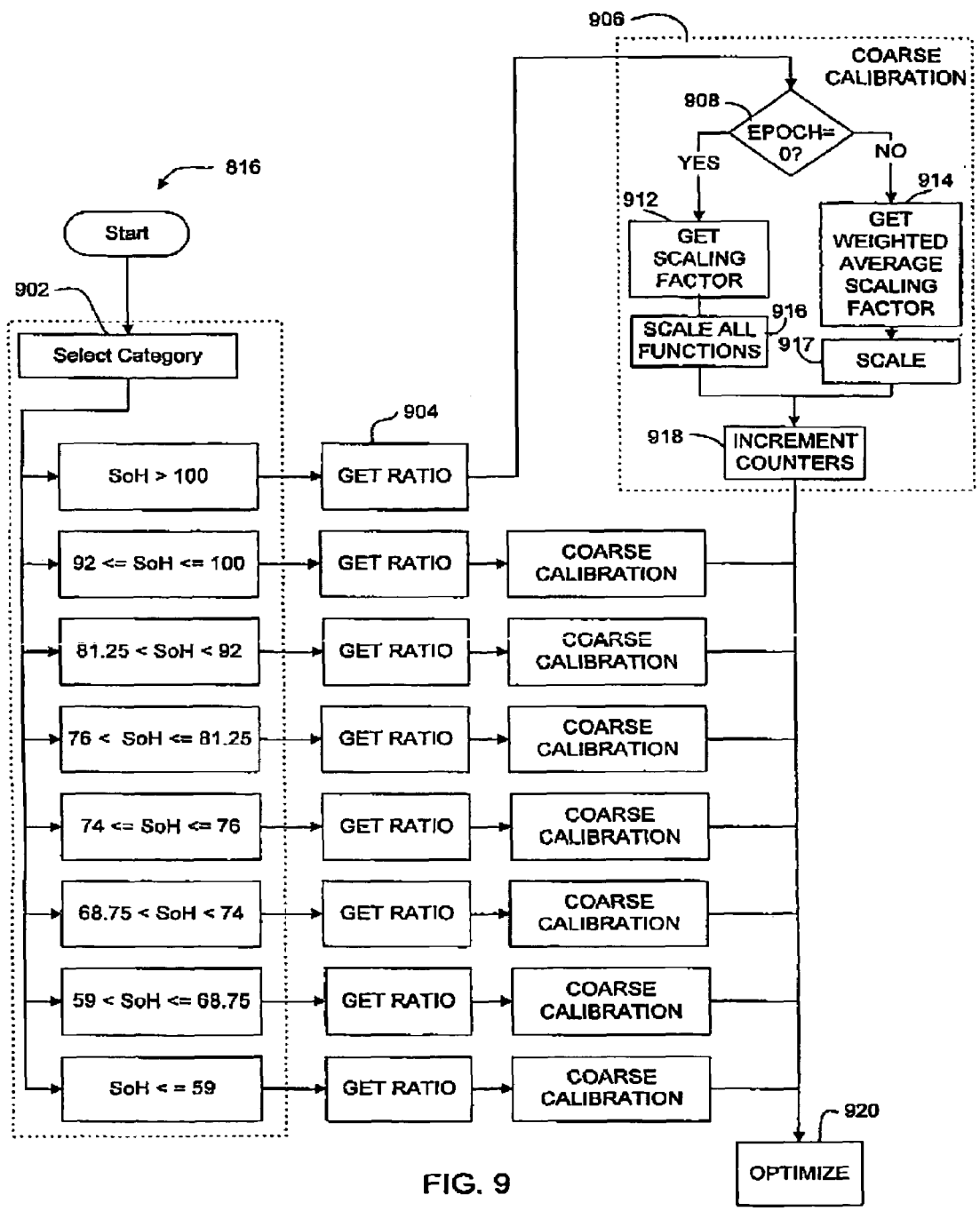
FIG. 9 is a flowchart illustrating a portion of the training method of FIG. 8 in more detail.

FIG. 9 illustrates training method 816 in more detail. Method 816 begins at block 902 by assigning the calibration battery to a calibration category according to the reliably-measured $SoH_{RM}$ recorded in block 807. Table IV shows a possible arrangement of calibration categories as is used in a currently preferred embodiment of the invention.

TABLE IV

Calibration Category and Scaling Parameters selected according to the value of $SoH_{RM}$

| | q, A and B → | | |
| --- | --- | --- | --- |
| $SoH_{RM}$ (%) ↓ | Calibration Category q | Scaling Parameter A | Scaling Parameter B |
| 0 <= $SoH_{RM}$ <= 59 | 1 | n/a | n/a |
| 59 < $SoH_{RM}$ <= 68.75 | 2 | 59 | 68.75 |
| 68.75 < $SoH_{RM}$ < 74 | 3 | 68.75 | 74 |
| 74 <= $SoH_{RM}$ <= 76 | 4 | 74 | 76 |
| 76 < $SoH_{RM}$ <= 81.25 | 5 | 76 | 81.25 |
| 81.25 < $SoH_{RM}$ < 92 | 6 | 81.25 | 92 |
| 92 <= $SoH_{RM}$ <= 100 | 7 | 92 | 100 |
| 100 < $SoH_{RM}$ | 8 | n/a | n/a |

In block 904 a ratio z is obtained. The ratio z is used in scaling the points which define the membership functions. The ratio z may be calculated using the following equation:

$$z = \begin{cases} 1, & SoH_{RM} \leq 59 \\ \frac{B - SoH_{RM}}{B - A}, & 59 < SoH_{RM} \leq 100 \\ 1, & 100 < SoH_{RM} \end{cases} \tag{4}$$

where A and B are the scaling parameters obtained from columns 3 and 4, respectively, of Table IV and $SoH_{RM}$ is the reliably-measured $SoH_{RM}$ recorded in block 807. In block 906, the ratio z obtained in block 904 is used to obtain a scaling factor for one or more membership functions of the prototype matrix.

How method 816 uses the reliably-measured $SoH_{RM}$ for calibration depends upon whether or not the current calibration battery is the first calibration battery. Method 816 can determine whether the current calibration battery is the first calibration battery since the epoch counter for the first battery has a value of zero, as determined at step 908. If the calibration battery is a first calibration battery then, in step 912, the method derives, for the membership functions corresponding to each of the parameters, a scaling factor, α. All of the membership functions for the parameter may be scaled by the same scaling factor $\alpha_0$. The result is that a SoH computed for the calibration battery with the use of the membership functions matches approximately the reliably-measured $SoH_{RM}$ for the calibration battery.

For each of the parameters, the method obtains a scaling factor by choosing a particular one of the points which define the membership functions for that parameter. Which one of the points is selected depends upon the calibration category of the calibration battery. For example, Table V identifies points which may be used for each of the calibration categories of Table IV:

TABLE V

Scaling Points for Parameter P

| Calibration Category q | Membership Function | Point (see FIG. 5A) |
|---|---|---|
| 1 | P-Poor | 502 |
| 2 | P-Poor | 504L |
| 3 | P-Good | 504L |
| 4 | P-Good | 502 |
| 5 | P-Good | 504R |
| 6 | P-Excellent | 504L |
| 7 | P-Excellent | 502 |
| 8 | P-Excellent | 502 |

The scaling factor $\alpha_0$ of block 912 may be calculated using the following equation:

$$\alpha_0 = \frac{[(1-z)x + zy]}{x} \quad (5)$$

where z is the ratio of equation (4), x is the current parameter value at the point identified in Table V for the current calibration battery, and y is the parameter value measured for the calibration battery.

In block 916, the three parameter values that define each membership function in the set of membership functions for each parameter (as shown for example in Table II) are each scaled according to a scaling function S(l, m, r, α)=(l', m', r'). The scaling function S(l, m, r, α)=(l', m', r') for each set of membership functions may be written in matrix form as follows:

$$\begin{bmatrix} l' \\ m' \\ r' \end{bmatrix} = \alpha * \begin{bmatrix} l \\ m \\ r \end{bmatrix} \quad (6)$$

where l', m' and r' are the three parameter values that define the triangular membership function (exemplified by points 504L, 502 and 504R respectively of FIG. 5A) after scaling; l, m and r are the three parameter values that define the triangular membership function (exemplified by points 504L, 502 and 504R respectively of FIG. 5A) to be scaled; and α is the scaling factor $\alpha_0$ of equation (5). In general, a different scaling factor will apply to the membership functions associated with each of the different parameters.

For example, suppose a first calibration battery has a $SoH_{RM}$ of 93%, the measured value for a parameter P is 50 and the set of membership functions in the prototype matrix which corresponds to that parameter is as set out in Table VI

TABLE VI

Membership Functions for Parameter P Before Scaling

| Function | l (504L) | m (502) | r (504R) |
|---|---|---|---|
| P-Excellent | 10 | 20 | 30 |
| P-Good | 25 | 35 | 45 |
| P-Poor | 35 | 45 | — |

Intuitively, if 93% is excellent, the method should scale this set of membership functions so that the value "50" measured for parameter P in the calibration battery corresponds generally to the peak of the P-Excellent membership function. A battery having a SoH of 93% is in calibration category 7 (from Table IV). Table V indicates that for calibration category 7 the scaling point is point 502 of the P-Excellent function. Therefore x has the value 20. The value of z in this case is 0.875 from equation (4) and from equation (5) $\alpha_0 \approx 2.3$. Multiplying each of the points which define this set of membership functions by 2.3 and rounding to integer values yields:

TABLE VII

Membership Functions for Parameter P After Scaling

| Function | l | m | r |
|---|---|---|---|
| P-Excellent | 23 | 46 | 69 |
| P-Good | 58 | 81 | 104 |
| P-Poor | 81 | 104 | — |

The sets of membership functions for the other parameters are scaled similarly.

The method then updates the counters (block 918) and proceeds to the optimization of block 920, as described below.

If the current calibration battery is not the first calibration battery (i.e. step 908 detects a non-zero value in the epoch counter) then only one of the points which defines the membership functions which correspond to each parameter may need to be changed. This is because the points which define the membership functions have already been scaled. Which one of the plurality (eight in the example being described here) of points which define the three membership functions associated with each parameter is scaled depends upon the calibration category to which the current test battery has been assigned. The point to be scaled is the same point identified in Table V. A new value for the point is obtained as a weighted average of its current value and the parameter value for the current calibration battery. The new value for the point obtained in block 914 may be calculated using the following equation;

$$x_{new} = \frac{c \times x_{old} + [(1-z)x_{old} + zy]}{c+1} \quad (7)$$

where $x_{new}$ is the new value for the point, $x_{old}$ is the existing value for the point, z is the ratio of equation (4); y is the parameter value measured for the calibration battery; and c is the value of the calibration counter of Table IIIa for the calibration category q of the current test battery (as determined in block 902).

For example, if y=130, c=0, z=1 and $x_{old}$=100 then $x_{new}$=130. If y=130, c=5, and $x_{old}$=100 and z=1 then $x_{old}$=105.

After scaling has been performed, block 918 increments the calibration counter $c_q$ corresponding to the calibration category selected in block 902. Block 918 also increments the epoch counter to maintain its value as the sum of the values of all $c_q$ associated with the particular modified prototype matrix or model-specific matrix in question. After coarse calibration is completed then an optimization is performed as indicated generally by block 920.

Figure 10:
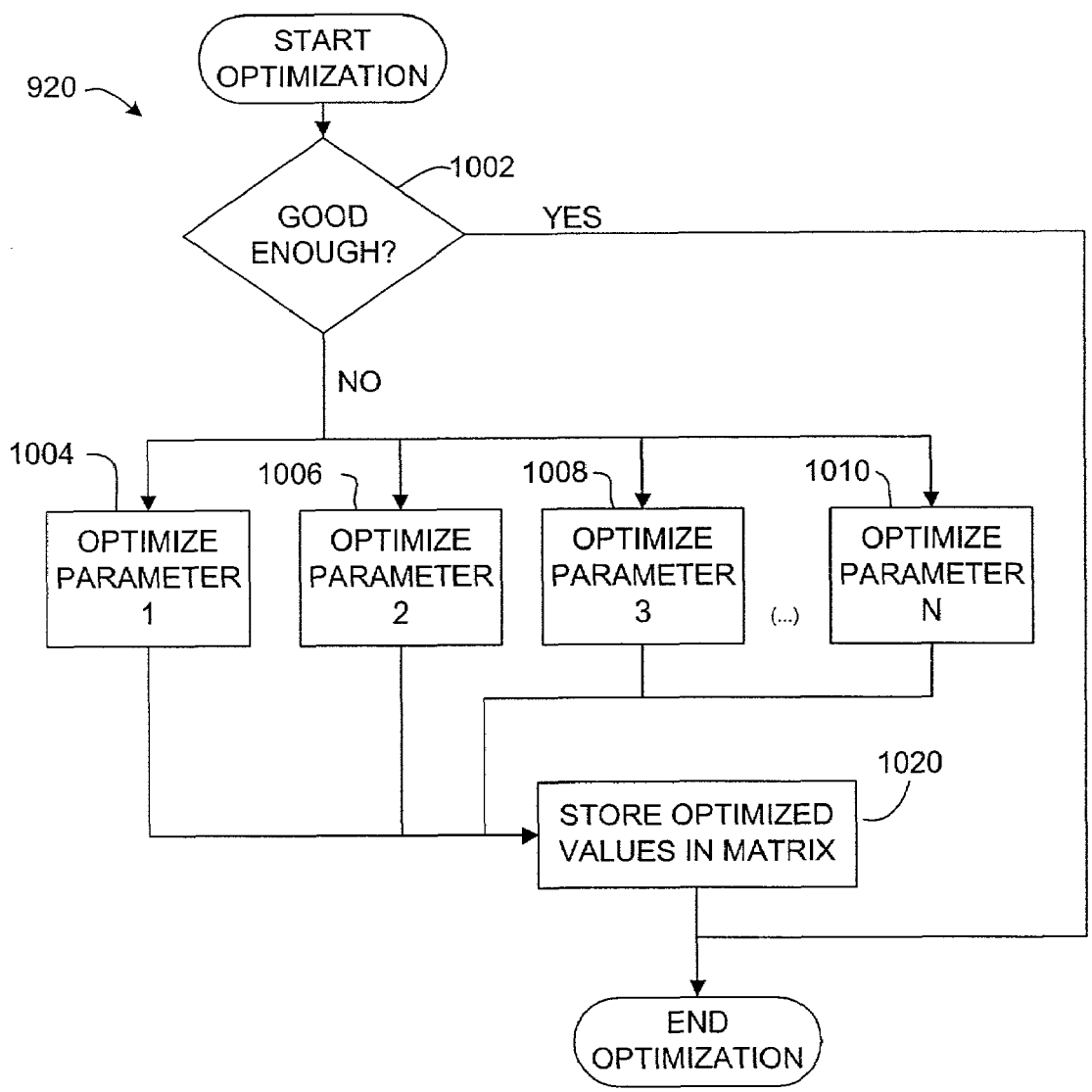
FIG. 10 is a flow chart illustrating operation of the optimization portion of the training method of FIG. 8.

As shown in FIG. 10, block 920 first checks to see if further optimization is required. If block 1002 determines that there is already a good match between the reliably-measured $SoH_{RM}$ of the calibration battery and the SoH computed using the existing scaled prototype matrix then further optimization is not required. Block 1002 may determine, for example, whether these values differ by more than a threshold amount (e.g. 2%) from one another. If not then the optimization routine terminates. If block 1002 determines that further optimization is required then an optimization is performed individually for each of the different parameters as indicated in blocks 1004 through 1010. Block 1020 stores the optimized values in a working copy of the prototype matrix. After optimization is completed and there are no more calibration batteries, block 820 of FIG. 8 stores the working copy of the prototype matrix as a model-specific matrix.

Figure 11A:
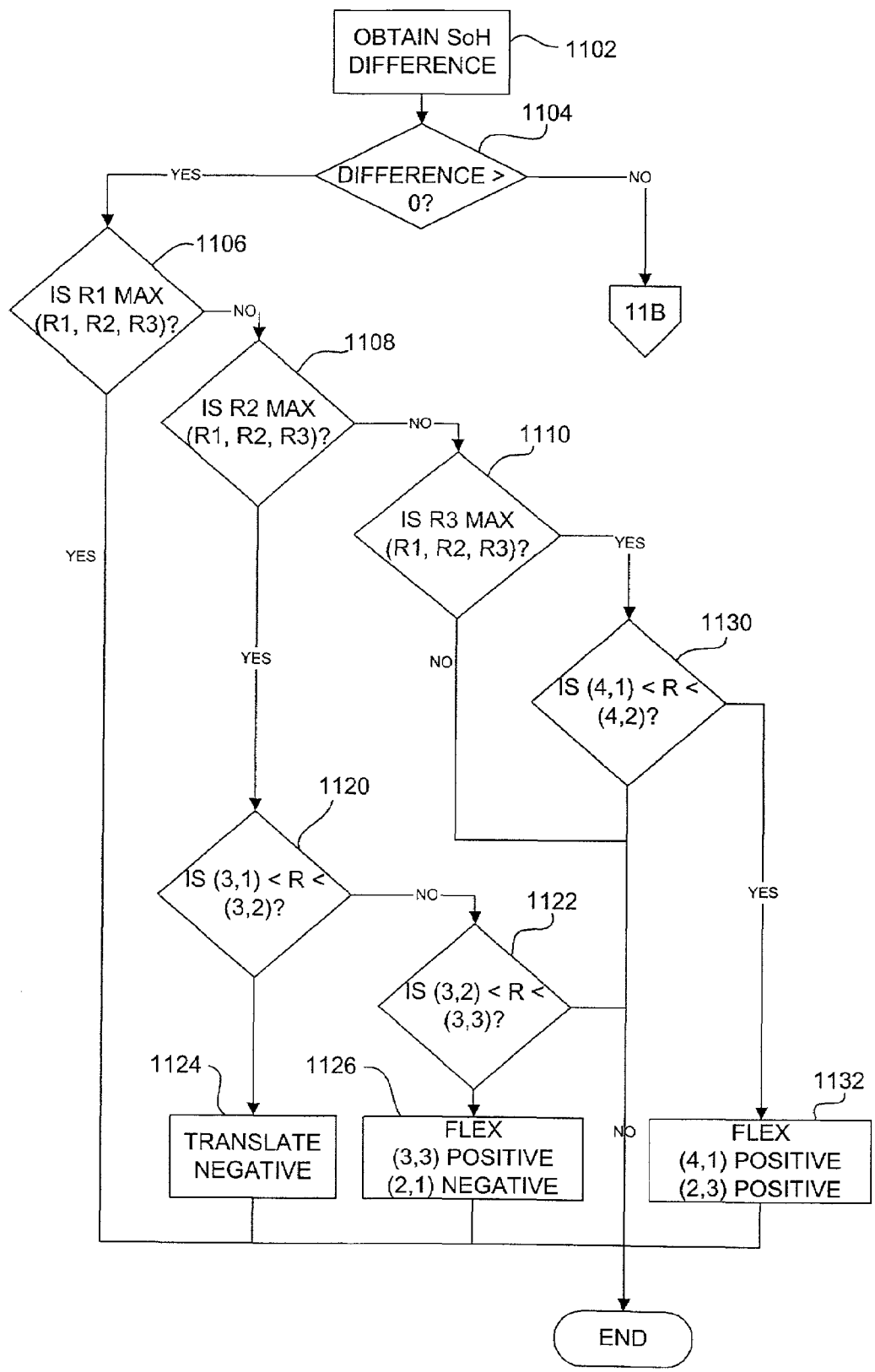
FIGS. 11A and 11B are flow charts illustrating an optimization routine for one parameter.
Figure 11B:
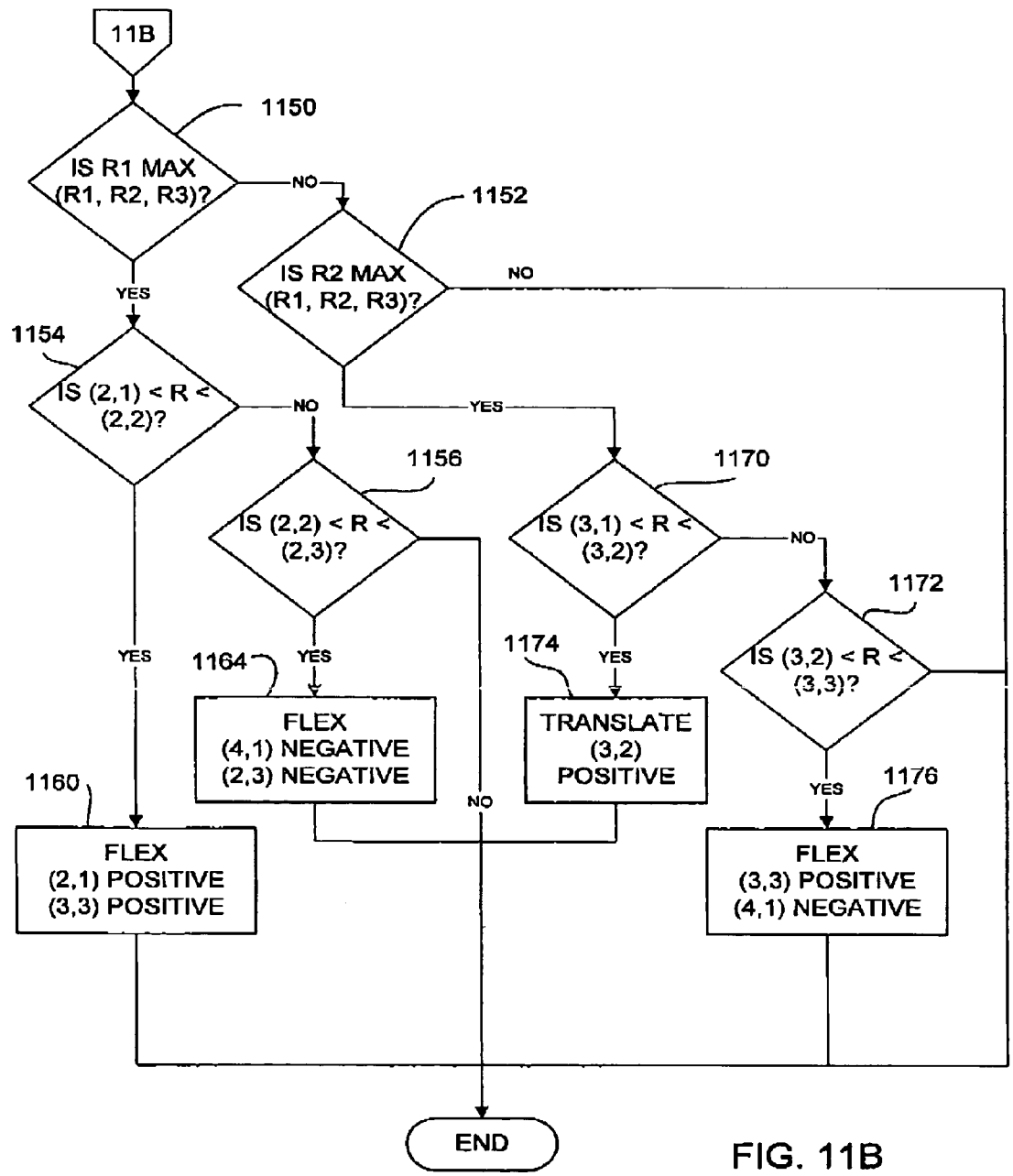
Figure 12A:
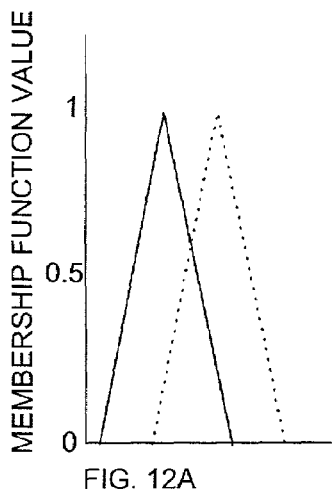
FIG. 12A is a graphical illustration of the processes of translating a fuzzy set.
Figure 12B:
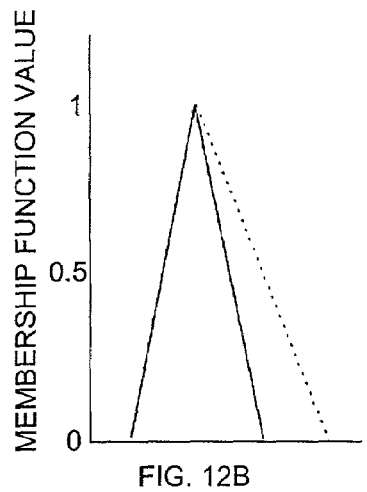
FIG. 12B is a graphical illustration of the processes of flexing a fuzzy set.

FIGS. 11A and 11B illustrate an optimization routine 1004 for one parameter, in this case internal resistance. Routine 1004 selectively translates and flexes the membership functions of Table II corresponding to internal resistance. FIGS. 12A and 12B illustrate translation and flexing respectively. Routine 1004 begins at block 1102 by obtaining a difference between the reliably-measured $SoH_{RM}$ for a calibration battery and the computed SoH obtained for the same battery using the current prototype matrix. Block 1104 determines whether this difference is positive or negative. If the difference is positive then the optimization blocks adjust the appropriate membership function(s) for that parameter so as to increase the computed SoH. If the difference is negative then the optimization blocks adjust the appropriate membership function(s) for that parameter so as to decrease the computed SoH.

FIG. 11A illustrates the situation wherein the difference is positive. Blocks 1106, 1108 and 1110 cooperate to select the one of the P membership functions (in this case P=3) associated with the current parameter for which the parameter value for the calibration battery has the greatest antecedent membership value. In blocks 1106, 1108 and 1110, R1 refers to the antecedent membership value of internal resistance in the membership function "R-excellent"; R2 refers to the antecedent membership value of internal resistance in the membership function "R-good"; and R3 refers to the antecedent membership value of internal resistance in the membership function "R-poor". If block 1106 determines that the resistance of the calibration battery already has strong membership in the "R-excellent" set then nothing further needs to be done for the resistance parameter.

Figure 13A:
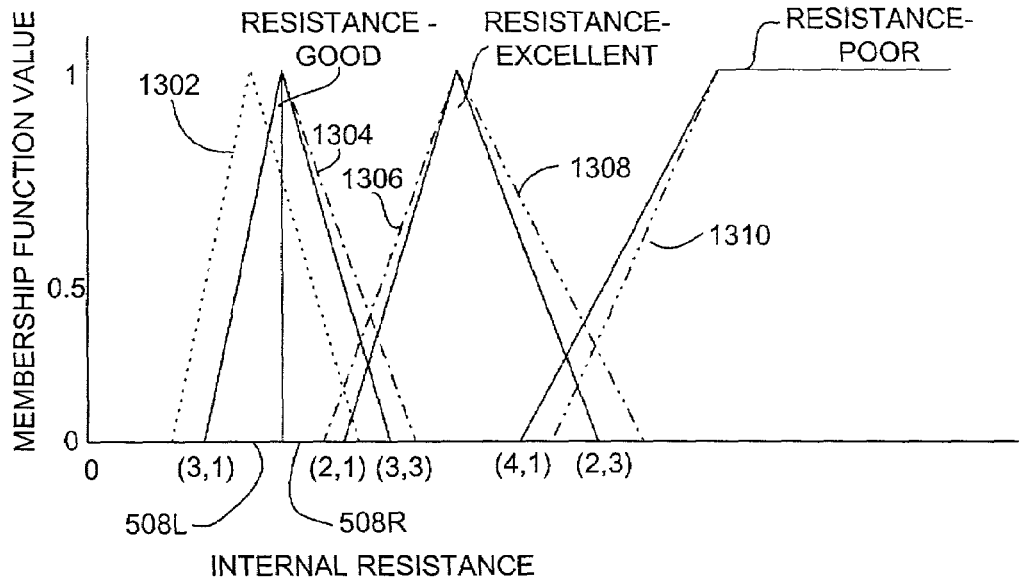
FIGS. 13A and 13B illustrate specific flex and translation operations that may occur in optimizing fuzzy sets for a parameter.

The bracketed pairs of numbers in FIG. 11A indicate row and column coordinates of a value in Table II. The row labelled "R-excellent" is numbered 2. The three values which define the locations of the vertices of the "R-excellent" fuzzy set are located at positions (2,1) (2,2) and (2,3) in Table II. If block 1108 indicates that the resistance parameter most strongly belongs to the "R-good" set (which is defined in row 3 of Table II) then blocks 1120 and 1122 determine whether the resistance parameter value for the calibration battery is in the low region 508L or the high region 508R of the range of resistance values which belong to the "R-good" set. If the resistance parameter value is in low region 508L then block 1124 translates the "R-good" set in the negative direction as illustrated by the dashed line indicated by 1302 in FIG. 13A. This tends to increase the SoH computed for the calibration battery.

If the resistance parameter value is in high region 508R then block 1126 flexes the "R-good" and "R-excellent" sets as indicated by dashed lines 1304 and 1306. The dashed line 1304 is an example of flexing positively wherein point (3,3) is moved along the abscissa in a positive direction. The dashed line 1306 is an example of flexing negatively wherein point (2,1) is moved along the abscissa in a negative direction. Simultaneously flexing the "R-good" and "R-excellent" sets has the overall effect of increasing the computed SoH.

If block 1110 indicates that the resistance parameter most strongly belongs to the "R-poor" set (which is defined in line 4 of Table II) then block 1130 determines whether the resistance parameter value for the calibration battery is in the low region 508L of the range of resistance values which belong to the "R-poor" fuzzy set. If so then block 1132 flexes the "R-excellent" and "R-poor" sets as illustrated by the dashed lines 1308 and 1310 in FIG. 13A. This tends to increase the SoH computed for the calibration battery.

FIG. 11B illustrates the operation of optimization routine 1004 in case the computed SoH is greater than the reliably-measured $SoH_{RM}$. Blocks 1150 and 1152 cooperate to select the one of the P membership functions (in this case P=3) associated with the current parameter for which the parameter value for the calibration battery has the greatest antecedent membership value.

Figure 13B:
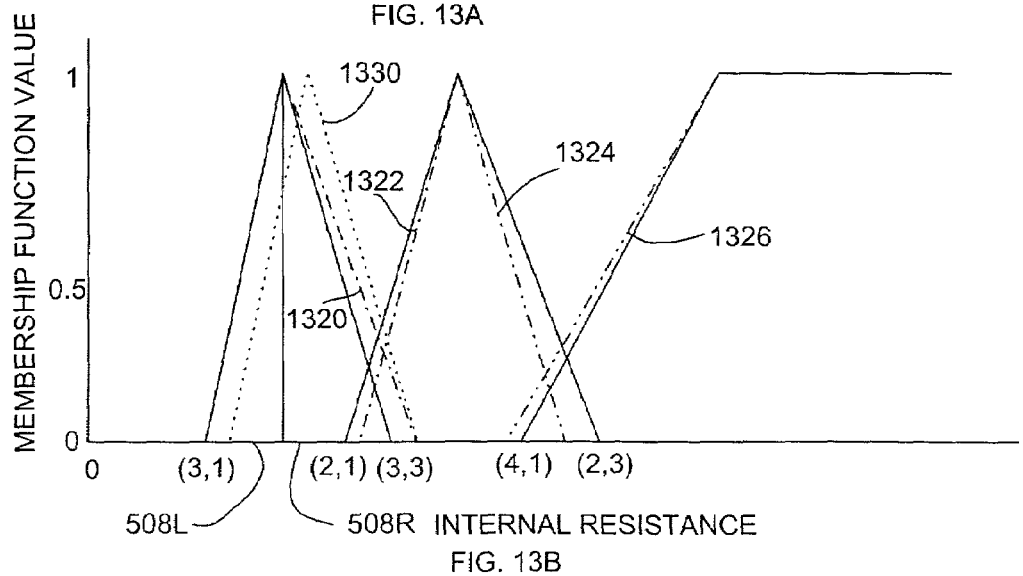

If the maximum antecedent membership value is for the "R-excellent" set then blocks 1154 and 1156 cooperate to determine whether the resistance value for the calibration battery lies in low region 508L or high region 508R of the "R-excellent" set. If the resistance value is in low region 508L then block 1160 causes the "R-good" and "R-excellent" sets to be flexed as indicated by dashed lines 1320 and 1322 in FIG. 13B. If the resistance value for the calibration battery is determined to be in high region 508R then "R-excellent" and "R-poor" sets are flexed as indicated by dashed lines 1324 and 1326 of FIG. 13B.

If block 1152 indicates that the measured resistance for the calibration battery has the greatest antecedent membership value in the "R-good" set then blocks 1170 and 1172 cooperate to determine whether the resistance value for the calibration battery lies in low region 508L or high region 508R of the "R-good" set. If the resistance value is in low region 508L then block 1174 causes the "R-good" set to be translated in the positive direction as indicated by dashed line 1330 in FIG. 13B. If the resistance value is in high region 508R then block 1176 causes the "R-good" and "R-excellent" sets to be flexed as indicated respectively by lines 1320 and 1326. Optimization for the remaining parameters proceeds in an analogous manner.

Figure 14:
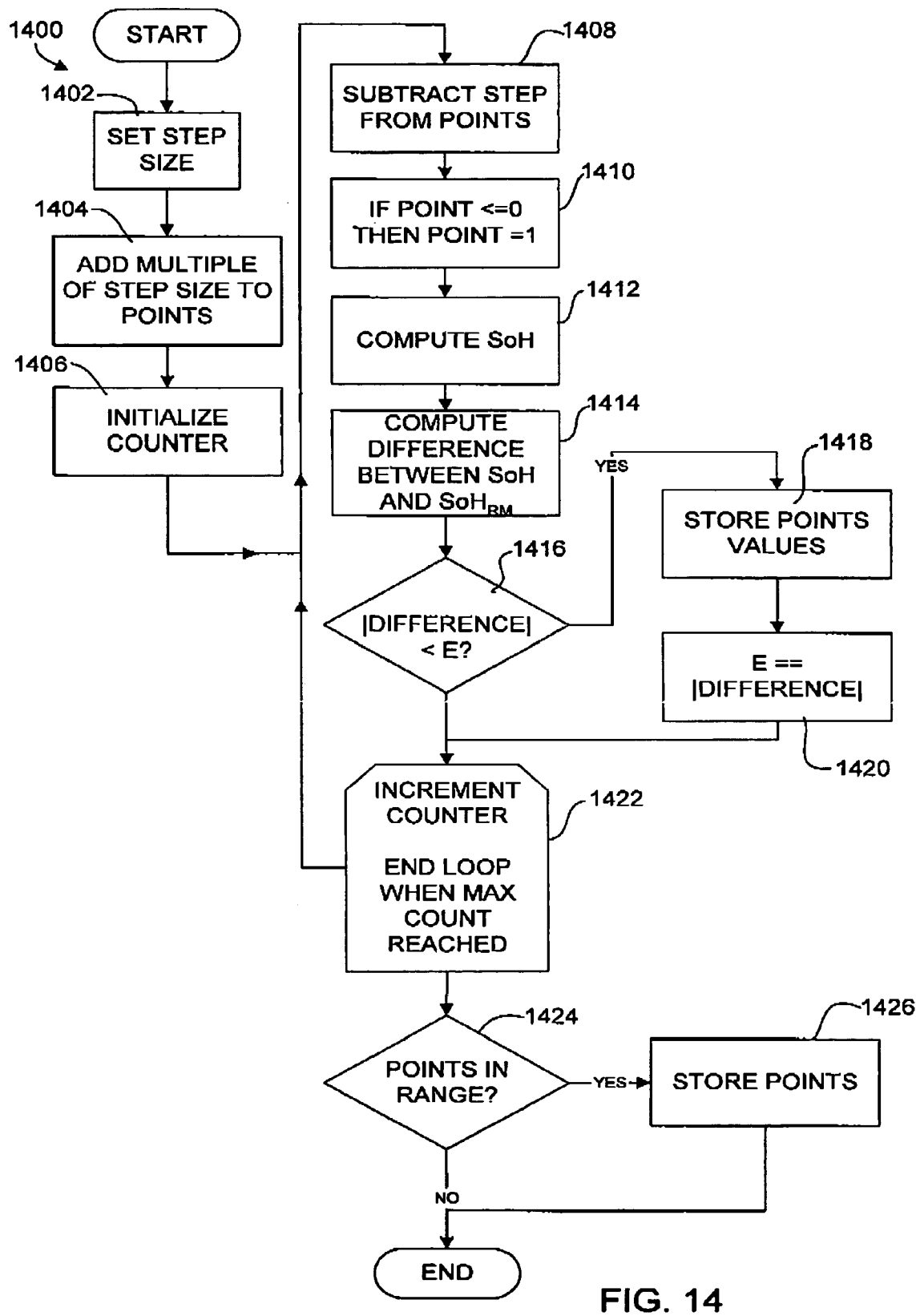
FIG. 14 is a process for translating a fuzzy set for use in the invention; and, FIG. 15 is a process for flexing a fuzzy set for use in the invention.

FIG. 14 illustrates a process 1400 which may be used to translate a fuzzy set. Process 1400 begins by establishing a step size in block 1402. Block 1402 may, for example, select a step size which is 5% of the parameter value corresponding to a point in the fuzzy membership function to be affected by the translation operation. In block 1404 a multiple of the step size, for example, 10 times the step size is added to each of the points to be affected by the translation. For example, a multiple of the step size may be added to points 504L, 502 and 504R when translating membership function 500 of FIG. 5A.

Block 1406 initializes a counter which is used to limit the number of repetitions of a loop (comprising blocks 1408 through 1422). In the loop, each point affected by the translation is translated in block 1408 by the step size. The point is prevented from having a negative value by block 1410. Block 1412 computes a SoH using a prototype matrix which has been modified to include the translated points. This computed SoH is compared to the reliably-measured $SoH_{RM}$ in block 1414. Block 1414 may, for example, compute a difference between the computed SoH and the reliably-measured $SoH_{RM}$.

If block 1416 determines that the magnitude of the difference is less than a threshold value, E, then the values of the translated points are stored (block 1418) and E is set equal to the difference (block 1420). Block 1422 ends the loop after a predetermined number of iterations. After the loop terminates, block 1424 checks to ensure that the points are within valid ranges. If so then block 1426 modifies the prototype matrix to include the values of the translated points which were most recently stored in block 1418.

Figure 15:
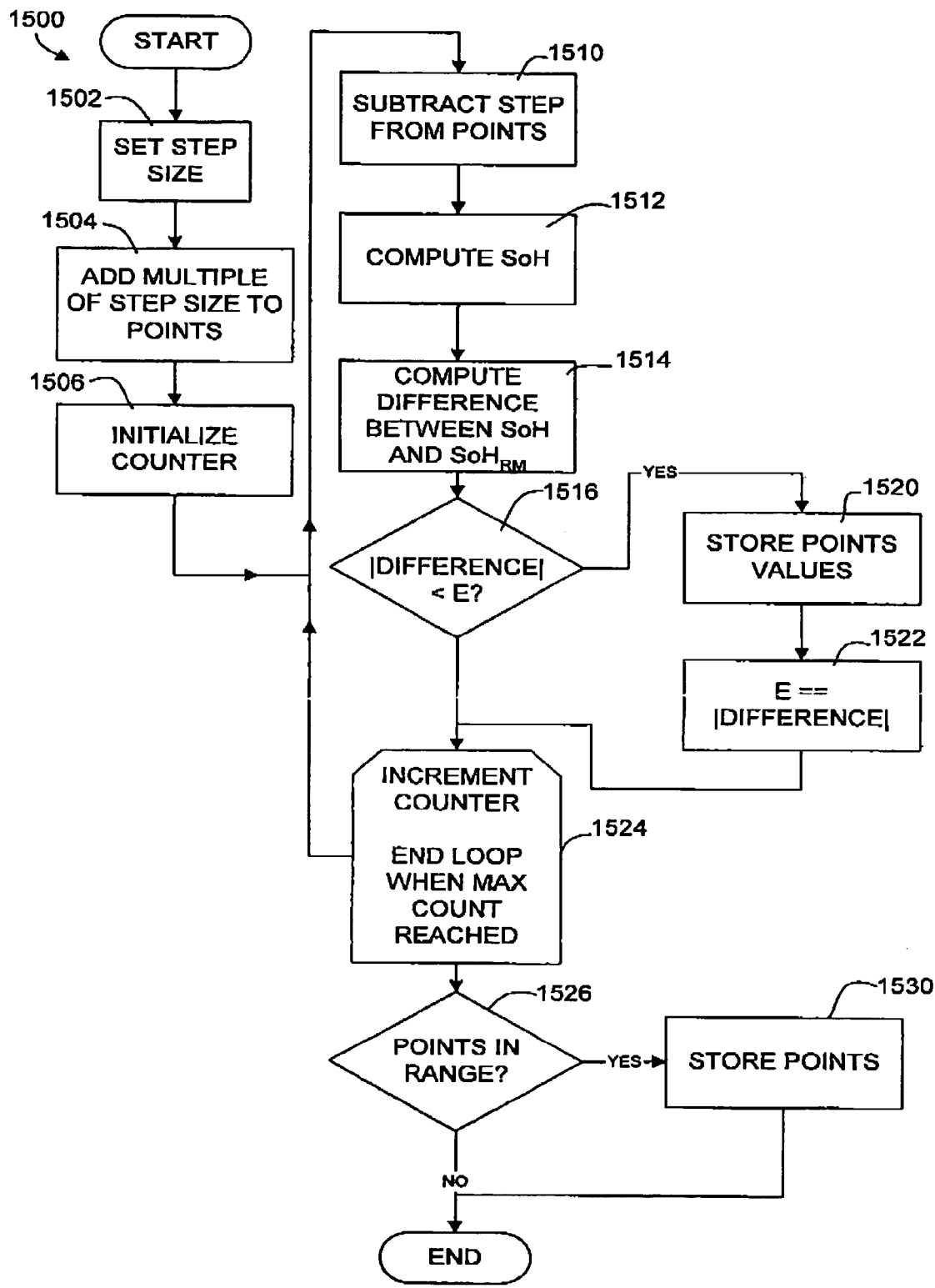

FIG. 15 illustrates a process 1500 which may be used to flex a fuzzy set. Process 1500 may simultaneously flex one, two or more membership functions. Process 1500 begins by establishing appropriate step sizes in block 1502. Block 1502 may, for example, select for each point to be affected by the flex operation a step size which is 5% of the parameter value corresponding to that point. In block 1504 a multiple of the step size, for example, 10 times the step size is added to each of the points to be affected by the flexing. For example, a multiple of the step size may be added to point 504L or point 504R or both when translating membership function 500 of FIG. 5A.

Block 1506 initializes a counter which is used to limit the number of repetitions of a loop (comprising blocks 1510 through 1524). In the loop, each point affected by the flexing is translated in the appropriate direction by the step size determined for that point in block 1510. Block 1512 computes a SoH using a prototype matrix which has been modified to include the translated points. This computed SoH is compared to the reliably-measured $SoH_{RM}$ in block 1514. Block 1514 may, for example, compute a difference between the computed SoH and the reliably-measured $SoH_{RM}$.

If block 1516 determines that the magnitude of the difference is less than a threshold value, E, then the values of the translated points are stored (block 1520) and E is set equal to the difference (block 1522). Block 1524 ends the loop after a predetermined number of iterations. After the loop terminates, block 1526 checks to ensure that the points are within valid ranges. If so then block 1530 modifies the prototype matrix to include the values of the translated points which were most recently stored in block 1520.

Preferred implementations of the invention comprise computers running software instructions which cause the computers to execute a method of the invention. The invention may also be provided in the form of a program product. The program product may comprise any medium which carries a set of computer-readable signals containing instructions which, when run by a computer, cause the computer to execute a method of the invention. The program product may be in any of a wide variety of forms. The program product may comprise, for example, physical media such as magnetic data storage media including floppy diskettes, hard disk drives, optical data storage media including CD ROMs, DVDs, electronic data storage media including ROMs, flash RAM, or the like or transmission-type media such as digital or analog communication links.

Where a component (e.g. an assembly, device, circuit, layer etc.) is referred to above, unless otherwise indicated, reference to that component (including a reference to a "means") should be interpreted as a reference to any component which performs the function of the described component (i.e., that is functionally equivalent), including components which are not structurally equivalent to the disclosed structure which performs the function in the illustrated exemplary embodiments of the invention. Accordingly, the scope of the invention is to be construed in accordance with the substance defined by the following claims.

As will be apparent to those skilled in the art in the light of the foregoing disclosure, many alterations and modifications are possible in the practice of this invention without departing from the spirit or scope thereof. For example, The invention could be practised by measuring different parameters than those discussed herein;

The invention could be applied to a fuzzy logic system for ascertaining SoH from the results of electrochemical impedance spectroscopy measurements; and, The invention could be applied using non-triangular membership functions.

Accordingly, the scope of the invention is to be construed in accordance with the substance defined by the following claims.

What is claimed is:

1. A computer-implemented method for training a fuzzy logic inference system to produce an output indicative of a characteristic of an electrochemical system in response to a plurality of parameter values of the electrochemical system, the method comprising:

providing a prototype set of fuzzy logic membership functions, the prototype set comprising a plurality of membership functions corresponding to each of a plurality of input parameters wherein the membership functions each produce an output that is a function of a value of the corresponding input parameter;

obtaining parameter values for the input parameters from a calibration system for which the characteristic has a known value;

for each of the parameter values obtained from the calibration system obtaining a system-specific set of fuzzy logic membership functions by scaling the corresponding plurality of membership functions relative to parameter value axes of the membership functions; and, using the system-specific set of membership functions to obtain outputs indicative of the characteristic of electrochemical test systems.

2. The method of claim 1 wherein the system comprises an electrochemical battery and the characteristic comprises a state of health of the battery.

3. The method of claim 2 wherein providing the prototype set of fuzzy logic membership functions comprises determining a chemistry type of the battery and selecting from a plurality of prototype sets of fuzzy logic membership functions a prototype set of fuzzy logic membership functions which matches the chemistry type of the battery.

4. The method of claim 2 wherein the fuzzy logic membership functions are triangular membership functions completely specifiable by three numbers.

5. The method of claim 4 wherein each of the membership functions is specified by a left intercept point, a mid-point and a right intercept point.

6. The method of claim 5 comprising optimizing the system-specific set of membership functions by:
   obtaining parameter values from one or more calibration batteries having known states of health,
   computing a state of health based upon the parameter values using the system-specific set of membership functions,
   comparing the computed state of health to the known state of health, and,
   flexing one or more of the membership functions in the system-specific set of membership functions.

7. The method of claim 6 wherein optimizing the system-specific set of membership functions comprises simultaneously flexing two or more of the membership functions in the system-specific set of membership functions.

8. The method of claim 6, wherein flexing one or more of the membership functions comprises determining a state of health for the calibration battery that would be obtained if the membership function were flexed by each of a plurality of different amounts and flexing the membership function in an amount corresponding to the determined state of health which best matches the actual state of health of the calibration battery.

9. The method of claim 8 wherein determining a state of health for the calibration battery that would be obtained if the membership function were flexed by each of a plurality of different amounts and flexing the membership function comprises:
   a) providing a step size;
   b) adding a multiple of the step size to a point of a triangular membership function to be flexed;
   c) initializing a counter and a threshold value;
   d) subtracting the step size from the point;
   e) computing state-of-health of the calibration battery using the flexed triangular membership function;
   f) obtaining a difference between the computed state-of-health and the known state-of-health;
   g) if a magnitude of the difference is less than a threshold value, setting the threshold value equal to the magnitude of the difference;
   h) incrementing the counter; and
   i) repeating steps d) to h) until the counter reaches a predetermined maximum number of repetitions.

10. The method of claim 6 comprising sequentially optimizing the membership functions associated with a plurality of the parameters.

11. The method of claim 5 comprising optimizing the system-specific set of membership functions by:
   obtaining parameter values from one or more calibration batteries having known states of health,
   computing a state of health based upon the parameter values using the system-specific set of membership functions,
   comparing the computed state of health to the known state of health, and,
   translating one or more of the membership functions in the system-specific set of membership functions.

12. The method of claim 11, wherein translating one or more of the membership functions comprises determining a state of health for the calibration battery that would be obtained if the membership function were translated by each of a plurality of different amounts and translating the membership function in an amount corresponding to the determined state of health which best matches the actual state of health of the calibration battery.

13. The method of claim 12, wherein determining a state of health for the calibration battery that would be obtained if the membership function were translated by each of a plurality of different amounts and translating the membership function comprises:
   a) providing a step size;
   b) adding a multiple of the step size to the points that define the membership function;
   c) initializing a counter and a threshold value;
   d) subtracting the step from the points that define the triangular membership function;
   e) modifying any points necessary to maintain all values of points positive;
   f) computing state-of-health using the translated triangular membership function;
   g) obtaining the difference between the computed state-of-health and the reliably-measured state-of-health;
   h) storing the points and setting a new threshold value equal to the magnitude of the difference if the magnitude of the difference is less than the threshold value;
   i) incrementing the counter; and
   j) repeating steps d) to i) until the counter reaches a predetermined maximum number of repetitions.

14. The method of claim 11 wherein a plurality of the parameters are selected from the group consisting of: an internal resistance; an open circuit voltage; a voltage measured while the battery is under load; and a time taken for a voltage to achieve a specified value.

15. The method of claim 11, wherein obtaining parameter values from the calibration battery comprises applying a test current waveform to the calibration battery; and computing a state of health based upon the parameter values using the system-specific set of membership functions comprises:
   a) deriving antecedent membership values in a number of fuzzy logic sets according to the values of the measured parameters;
   b) deriving consequent membership values by the application of fuzzy logic rules to the antecedent membership values; and,
   c) deriving an assessment of state-of-health by computing a weighted average of the consequent membership values.

16. The method of claim 15, comprising assessing a state of health of a test battery by obtaining a set of measured parameter values for the test battery, from the measured parameter values computing membership in fuzzy sets specified by the membership functions in the model-specific set of membership functions and applying a set of fuzzy logic rules to the fuzzy sets.

17. The method of claim 16 wherein the fuzzy logic rules comprise a rule for each possible combination of memberships of the parameters.

18. The method of claim 17, wherein applying the set of rules comprises evaluating each rule by computing the minimum of the antecedent membership values considered by the rule.

19. The method of claim 18, wherein the fuzzy logic rules are grouped and each group of rules is associated with a definitional consequent membership value in a set of definitional consequent membership values.

20. The method of claim 19, wherein the set of definitional consequent membership values is ordered and equispaced throughout a desired range of output values.

21. The method of claim 20 comprising a state of health for the test battery as a centroid of weighted definitional consequent membership values.

22. The method of claim 1 wherein the fuzzy logic membership functions are triangular membership functions each having a left intercept point, a mid-point and a right intercept point wherein the method comprises refining the system-specific set of membership functions by, for each of a plurality of calibration systems:
   a) determining a value for the characteristic and measuring a plurality of parameter values;
   b) based upon the value of the characteristic, assigning the calibration system to a calibration category;
   c) based upon the calibration category, identifying a particular point on one of the plurality of membership functions associated with each of the parameters to be scaled; and,
   d) for the plurality of membership functions associated with each of the parameters, scaling the point.

23. The method of claim 22 wherein scaling the point comprises taking a weighted average of a measured parameter value of the test system and a current value for the point.

24. The method of claim 23 wherein scaling the point comprises performing the computation:

$$x_{new} = \frac{c \times x_{old} + [(1-z)x_{old} + zy]}{c+1}$$

where $x_{new}$ is the new value for the point, $x_{old}$ is the existing value for the point, z is a function of the value of the characteristic for the calibration system, y is one parameter value of the calibration system, and c is a number of calibration systems that have previously been associated with the calibration category.

25. The method of claim 24 wherein z is given by:

$$z = \frac{B - CharacteristicValue}{B - A}$$

where A and B are scaling values associated with the calibration category of the test system.

26. The method of claim 25 wherein the calibration categories correspond to the characteristic value of the calibration system as set out in Table IV.

27. The method of claim 1 wherein the fuzzy logic membership functions are triangular membership functions each having a left intercept point, a mid-point and a right intercept point and the method comprises optimizing the system-specific set of membership functions by:
   obtaining parameter values from one or more additional calibration systems having known characteristics;
   for each of the calibration systems computing a characteristic value based upon the parameter values using the system-specific set of membership functions;
   comparing the computed characteristic to the known characteristic; and,
   flexing one or more of the membership functions in the system-specific set of membership functions in response to a difference between the computed characteristic and the known characteristic.

28. The method of claim 27 wherein optimizing the system-specific set of membership functions comprises simultaneously flexing two or more of the membership functions in the system-specific set of membership functions.

29. The method of claim 1 wherein the fuzzy logic membership functions are triangular membership functions each having a left intercept point, a mid-point and a right intercept point and the method comprises optimizing the system-specific set of membership functions by:
   obtaining parameter values from one or more additional calibration systems having known characteristics;
   for each of the calibration systems computing a characteristic value based upon the parameter values using the system-specific set of membership functions;
   comparing the computed characteristic to the known characteristic; and,
   translating one or more of the membership functions in the system-specific set of membership functions in response to a difference between the computed characteristic and the known characteristic.

30. An automatic battery testing method which comprises training a fuzzy logic battery analyzer for assessing the state-of-health of batteries of a known model and chemistry type, the method comprising:
   providing a prototype set of prototype fuzzy logic membership functions which matches the chemistry type of the model of batteries to be tested wherein the membership functions each produce an output that is a function of a value of a corresponding parameter;
   measuring a capacity of a battery of the model of batteries to be tested which has a known state of health and applying a current waveform to the battery and measuring a plurality of parameter values;
   for each of the parameter values obtaining a model-specific set of fuzzy logic membership functions by scaling a corresponding plurality of the membership functions of the prototype set relative to parameter value axes of the membership functions; and,
   using the model-specific set of membership functions in combination with a set of fuzzy logic rules to assess the states of health of one or more batteries to be tested.

31. The method of claim 30 wherein each of the membership functions is defined by a plurality of points and, scaling a corresponding plurality of membership functions in the prototype set comprises, based upon the known state of health, for each parameter, identifying a point in a membership function corresponding to the parameter; and scaling all of the points for membership functions corresponding to the parameter by a scaling factor based upon the measured value of the parameter and the value of the identified point.

32. The method of claim 31 wherein the scaling factor is given by:

$$\alpha_0 = \frac{[(1-z)x + zy]}{x}$$

where z is a function of the value of the known state of health of the calibration battery, x is the value of the identified point, and y is the parameter value measured for the calibration battery.

33. The method of claim 32 wherein z is given by:

$$z = \frac{B - SoH_{RM}}{B - A}$$

where A and B are scaling values associated with a calibration category of the test system and $SoH_{RM}$ is the known state of health of the calibration battery.

34. The method of claim 33 wherein the calibration categories correspond to the characteristic value of the calibration system as set out in Table IV.

35. The method of claim 31 wherein the membership functions are triangular.

36. A computer-implemented method for training a characteristic measuring system to produce an output indicative of a characteristic of an electrochemical test system in response to a plurality of parameter values of the test system, the method comprising:
providing a prototype set of functions, the prototype set comprising a plurality of functions, each one of the functions corresponding to a corresponding one of the parameters wherein the functions each produce an output that is a function of a value of the corresponding one of the parameters;
obtaining parameter values for each of the parameters from a calibration system for which the characteristic has a known value;
for each of the parameter values obtained from the calibration system, obtaining a system-specific set of functions by scaling the corresponding plurality of functions relative to parameter value axes of the functions; and
using the system-specific set of functions to obtain one or more outputs indicative of the characteristic of an electrochemical test system.

37. A method according to claim 36 wherein the functions are triangular functions.

38. A method according to claim 37 wherein the triangular functions each have a left intercept point, a mid-point and a right intercept point and the method comprises:
obtaining parameter values from one or more additional calibration systems having known characteristics;
for each of the calibration systems, computing a characteristic value based upon the parameter values using the system-specific set of triangular functions;
comparing the computed characteristic to the known characteristic; and
moving one or more of the left intercept point, mid-point and right intercept point for one or more of the triangular functions in the system-specific set of triangular functions in response to a difference between the computed characteristic and the known characteristic.

39. A method according to claim 38 comprising:
obtaining parameter values from one or more additional calibration systems having known characteristics;
for each of the calibration systems, computing a characteristic value based upon the parameter values using the system-specific set of triangular functions;
comparing the computed characteristic to the known characteristic; and
translating one or more of the triangular functions in the system-specific set of triangular functions in response to a difference between the computed characteristic and the known characteristic.

* * * * *